(12) United States Patent  (10) Patent No.: US 6,936,837 B2
Yamada et al.  (45) Date of Patent: Aug. 30, 2005

(54) FILM BULK ACOUSTIC RESONATOR

(75) Inventors: Tetsuo Yamada, Ube (JP); Keigo Nagao, Ube (JP); Chisen Hashimoto, Ube (JP); Morito Akiyama, Tosu (JP); Naohiro Ueno, Tosu (JP); Hiroshi Tateyama, Tosu (JP)

(73) Assignees: UBE Industries, Ltd., Yamaguchi (JP); National Institute of Advanced Industrial Science and Technology, Tokyo (JP)

( * ) Notice: Subject to any disclaimer, the term of this patent is extended or adjusted under 35 U.S.C. 154(b) by 102 days.

(21) Appl. No.: 10/477,308
(22) PCT Filed: May 10, 2002
(86) PCT No.: PCT/JP02/04576
§ 371 (c)(1), (2), (4) Date: Nov. 10, 2003
(87) PCT Pub. No.: WO02/093740
PCT Pub. Date: Nov. 21, 2002

(65) Prior Publication Data
US 2004/0135144 A1 Jul. 15, 2004

(30) Foreign Application Priority Data

May 11, 2001 (JP) ........................ 2001-141846
Jun. 15, 2001 (JP) ........................ 2001-182196
Dec. 26, 2001 (JP) ........................ 2001-394388

(51) Int. Cl.[7] ............................................. H01L 47/00
(52) U.S. Cl. ............................... 257/2; 257/4; 438/900; 333/189
(58) Field of Search ................... 257/2, 4; 438/900; 333/189

(56) References Cited

U.S. PATENT DOCUMENTS 3,805,601 A * 4/1974 Jeffers ........................... 73/777
4,320,365 A * 3/1982 Black et al. ................. 333/187
5,185,589 A * 2/1993 Krishnaswamy et al. ... 333/133
5,872,493 A * 2/1999 Ella ............................. 333/191
6,081,171 A * 6/2000 Ella ............................. 333/189
6,384,697 B1 * 5/2002 Ruby ........................... 333/189
6,388,544 B1 * 5/2002 Ella ............................. 333/189
6,555,946 B1 * 4/2003 Finder et al. ................ 310/324
6,586,861 B2 * 7/2003 Misu et al. .................. 310/324

FOREIGN PATENT DOCUMENTS

| JP | 58-153412 A | 9/1983 |
|----|-------------|--------|
| JP | 60-142607 A | 7/1985 |
| JP | 9-130199 A | 5/1997 |
| JP | 9-130200 A | 5/1997 |
| JP | 10-318864 A | 12/1998 |
| JP | 11-284480 A | 10/1999 |
| JP | 2000-244030 A | 9/2000 |
| JP | 2000-332569 A | 11/2000 |

* cited by examiner

Primary Examiner—Luan Thai
(74) Attorney, Agent, or Firm—Frommer Lawrence & Haug LLP; Ronald R. Santucci

(57) ABSTRACT

A thin film bulk acoustic resonator comprises a substrate (12) of a silicon single crystal, a base film (13) formed on the substrate (12) and composed of a dielectric film mainly containing silicon oxide, and a piezoelectric stacked structure (14) formed on the base film (13). A vibratory section (21) composed of a part of the base film (13) and a part of the piezoelectric stacked structure (14). The piezoelectric stacked structure (14) includes a lower electrode (15), a piezoelectric film (16), and an upper electrode (17) formed in this order from below. The substrate (12) had a via hole (20) in the region corresponding to the vibratory section (21). The via hole forms a space for allowing vibration of the vibratory section (21). The piezoelectric film (16) is an aluminum nitride thin film containing 0.2 to 3.0 atom % of alkaline earth metal and/or a rare earth metal. Thus, the thin film bulk acoustic resonator has a high performance such as a large electromechanical coupling coefficient, an excellent acoustic quality factor (Q) and an excellent frequency-temperature characteristic.

51 Claims, 5 Drawing Sheets

FILM BULK ACOUSTIC RESONATOR

This application is a 371 of PCT/JP02/04576 filed on May 10, 2002, published on Nov. 21, 2002 under publication number WO 02/093740 A1 and claims priority benefits of Japanese Patent Application No. 2001-141846 filed May 11, 2001 and Japanese Patent Application No. 2001-182196 filed Jun. 15, 2001 and Japanese Patent Application No. 2001-394388 filed Dec. 26, 2001.

TECHNICAL FIELD

The present invention relates to a thin film bulk acoustic resonator which is a device using a piezoelectric thin film for use in a broad field such as a thin film resonator, a thin film voltage controlled oscillator (VCO), a thin film band-pass filter, a duplexer, various types of sensors, and the like used in mobile communication equipments, and the like.

Moreover, the present invention relates to a stacked structure using an aluminum nitride thin film useful as a piezoelectric thin film of the thin film bulk acoustic resonator.

BACKGROUND ART

A device based on a piezoelectric phenomenon has been used in a broad field. In the progress of miniaturization and power saving of portable telecommunication equipments such as a cellular phone, use of surface acoustic wave (SAW) devices such as filters for RF and IF has been enlarged. Advanced design and producing technologies of SAW filters have satisfied user's strict requirements to specifications. However, as frequencies for use are shifted to higher frequencies, the enhancement of characteristics has approached its upper limit, and great technical innovation has been required for both of microstructure of electrodes to be formed and maintenance of stable outputs.

On the other hand, a thin film bulk acoustic resonator (hereinafter referred to as FBAR) using thickness vibration of a piezoelectric thin film, and stacked thin film bulk acoustic wave resonators and filters (hereinafter referred to as SBAR) are constructed by forming a thin film mainly composed of piezoelectric material and electrodes for driving the film on a membrane disposed on a substrate, and fundamental resonance is possible in a giga-hertz band. Band-pass filter constituted by FBAR or SBAR can remarkably be miniaturized, and can also be operated with a low insertion loss and in a broad pass band. In addition, the band-pass filter can be manufactured integrally with a semiconductor integrated circuit, and is therefore expected to be applied to future ultra-miniature portable telecommunication equipments.

SAW filters, applied to the resonator, band-pass filter, and the like using the surface acoustic wave are manufactured by forming a interdigitated structure electrode or reflector for exciting the surface acoustic wave on the surface of a wafer consisting of piezoelectric single crystals such as lithium niobate and lithium tantalate. After that, the wafer is divided into pieces of device unit to obtain the SAW filters. In recent years, the following method for manufacturing the SAW filter has also been studied. A piezoelectric thin film is formed on a semiconductor single crystal substrate such as silicon, a hard substrate obtained by forming polycrystalline diamond on a silicon wafer, and the like by applying various thin film forming methods. Next, interdigitated structure electrode or reflector for exciting the surface acoustic wave is formed on the surface of the piezoelectric thin film by micro-fabrication or patterning technique. Finally, the substrate is divided into pieces of device unit to obtain the SAW filters.

Moreover, the thin film piezoelectric devices (hereinafter referred to also as the piezoelectric thin film devices) such as FBAR and SBAR applied to the resonators, band-pass filters, and the like using the acoustic wave are manufactured as follows. A base film including a dielectric thin film, a conductive thin film, or a stacked film composed of these is formed on a semiconductor single crystal substrate such as silicon, a substrate including polycrystalline diamond formed on the silicon wafer, or a substrate formed of metals with constant elastic modulus such as elinvar by various thin film forming methods. The piezoelectric thin film is formed on the base film, and an upper structure including a required constitution is further formed. After forming each layer or all layers, each film is subjected to micro-fabrication and patterning by a physical or chemical treatment. After preparing a bridge structure in which a portion positioned under a vibratory section of the piezoelectric thin film is removed from the substrate by anisotropic etching, the structure is finally divided into pieces of device unit to obtain a thin film bulk acoustic resonator (hereinafter referred to also as the thin film piezoelectric resonator).

For example, for the thin film piezoelectric device described in JP(A)-58-153412 or JP(A)-60-142607, after forming the base film, lower electrode, piezoelectric thin film, and upper electrode on the substrate, a via hole is formed to manufacture the device by removing a substrate portion positioned under a portion of the vibratory section from the back surface of the substrate.

Aluminum nitride (AlN), zinc oxide (ZnO), cadmium sulfide (CdS), lead titanate [PT] ($PbTiO_3$), lead zirconate titanate [PZT] ($Pb(Zr, Ti)O_3$), and the like are used as piezoelectric materials for the thin film piezoelectric device. Especially, AlN has a high propagation speed of the acoustic wave, and is suitable as the piezoelectric material for the thin film resonator or thin film band-pass filter which operates in a high frequency (microwave) band.

Various studies have heretofore been conducted so as to apply an AlN thin film to FBAR or SBAR. However, the thin film resonator or thin film band-pass filter which fulfils a sufficient performance in a giga-hertz band has not been obtained yet, and there has been a demand for improvement of an acoustic quality factor (Q value), temperature coefficient of frequency, and insertion loss of the AlN thin film. A thin film piezoelectric device superior in all of the acoustic quality factor (Q value), broad band operation, and frequency-temperature characteristic and indicating high performance in resonance characteristic has not been proposed. An electromechanical coupling coefficient is an important parameter which influences the above-described performance in constituting the resonator or band-pass filter, and largely depends on a crystal quality of the piezoelectric thin film for use.

To solve the problem, an object of the present invention is to provide a thin film bulk acoustic resonator in which characteristics of the AlN thin film having the high propagation speed of the acoustic wave are used, and which is large in the electromechanical coupling coefficient and superior in the acoustic quality factor (Q value) and frequency-temperature characteristic or which is superior in characteristic aspects such as a bandwidth, insertion loss, and gain, and which is remarkably high in characteristics and performance as compared with a conventional resonator.

Moreover, an object of the present invention is to provide a thin film piezoelectric resonator in which the characteristics of the AlN thin film are used, and which is large in the electromechanical coupling coefficient and therefore superior in the acoustic quality factor (Q value), bandwidth and frequency-temperature characteristic, and which can realize FBAR or SBAR with superior characteristics and high performance as compared with the conventional resonator. Furthermore, an object of the present invention is to provide a stacked structure which is suitable for realizing the thin film piezoelectric resonator comprising aluminum nitride thin film.

DISCLOSURE OF THE INVENTION

The present inventors have found that resonance characteristics of FBAR including an AlN thin film formed as a piezoelectric thin film (piezoelectric film) on a substrate of Si or the like are remarkably improved by adding a third component such as an alkaline earth metal, a rare earth metal and the like to the AlN thin film. It has also been found that with the use of a high-quality AlN thin film to which the third component has been added in FBAR, it is possible to realize a high-performance FBAR large in an electromechanical coupling coefficient and superior in a Q value, bandwidth and frequency-temperature characteristic, and the present invention has been reached.

In order to attain the above objects, according to the present invention, there is provided a thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a piezoelectric film, and an upper electrode stacked in this order on the side of the substrate, the substrate comprising a gap formed in a region corresponding to the vibratory section to allow vibration of the vibratory section, wherein the piezoelectric film is an aluminum nitride thin film containing an alkaline earth metal and/or a rare earth metal.

In an aspect of the present invention, a content of the alkaline earth metal and the rare earth metal in the piezoelectric film is in a range of 0.2 to 3.0 atom %. In an aspect of the present invention, the piezoelectric film indicates a C-axis orientation, and full-width half maximum of a rocking curve of an X-ray diffraction peak of (0002) plane of the piezoelectric film is 3.0° or less. In an aspect of the present invention, the piezoelectric film has a C-axis length in a range of 0.4978 to 0.4993 nm. In an aspect of the present invention, for the piezoelectric film, full-width half maximum of a 2θ rotation angle of an X-ray diffraction peak of (0002) plane is 0.6° or less.

In an aspect of the present invention, a base film is formed between the substrate and the piezoelectric stacked structure, and the vibratory section (vibration diaphragm) also includes a part of the base film. In an aspect of the present invention, the base film is a dielectric film containing silicon oxide which is a major component, a dielectric film containing silicon nitride which is the major component, or a stacked film of the dielectric film containing silicon oxide which is the major component and the dielectric film containing silicon nitride which is the major component.

In an aspect of the present invention, the substrate is made of a single crystal silicon. In an aspect of the present invention, the upper electrode comprises a first electrode portion and a second electrode portion formed apart from each other.

In an aspect of the present invention, an electromechanical coupling coefficient obtained from measured values of a resonant frequency and an antiresonance frequency in a range of 2.0 to 3.0 GHz is 4.5% or more.

In the present invention, when the AlN thin film is formed, the alkaline earth metal or rare earth metal is added as a thin film raw material, and accordingly the AlN thin film containing these third components is formed to constitute the piezoelectric film of FBAR. When the alkaline earth metal or rare earth metal is added, concentration of oxygen solved in a crystal lattice of AlN can be reduced. Additionally, coupling strength of a grain boundary of C-axis oriented AlN particles can be increased, and the performances of the resonator and filter are considered to be largely enhanced.

Moreover, the present inventors have found that the resonance characteristics of FBAR or SBAR including the AlN thin film disposed as the piezoelectric thin film on the substrate of Si or the like largely depend on a state of lattice matching in an interface between a thin film metal electrode and the AlN thin film. It has also been found that by the addition of gallium nitride (GaN) or indium nitride (InN) having the same wurtzite type crystal structure with respect to AlN to control an a-axis length of the crystal lattice, the resonance characteristics are remarkably improved, and the present invention has been reached.

That is, the a-axis length of a GaN crystal has a value around 0.319 nm, that of an InN crystal has a value around 0.353 nm, and these are larger than the a-axis length (value around 0.311 nm) of an AlN crystal. Therefore, when GaN or InN is solved in the crystal lattice of AlN, the a-axis length is increased to improve agreement with a lattice length of a specific orientation of the metal crystal constituting the lower electrode, and an excellent lattice matching relation can be realized.

In order to attain the above objects, according to the present invention, there is provided a thin film bulk acoustic resonator comprising: a vibratory section including a part of a piezoelectric stacked structure including a piezoelectric film and electrodes formed on opposite surfaces of the piezoelectric film, wherein the piezoelectric film is a highly oriented crystal film comprising a solid solution of aluminum nitride and gallium nitride represented by a general formula $Al_{1-x}Ga_xN$ (additionally, 0<x<1) or a solid solution of aluminum nitride and indium nitride represented by a general formula $Al_{1-y}In_yN$ (additionally, 0<y<1).

In an aspect of the present invention, the piezoelectric stacked structure comprises a plurality of piezoelectric films and electrodes formed on opposite surfaces of each of the plurality of piezoelectric films. In an aspect of the present invention, a peripheral portion of the piezoelectric stacked structure is supported by the substrate and a middle portion of the piezoelectric stacked structure constitutes the vibratory section.

In order to attain the above objects, according to the present invention, there is provided a thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a piezoelectric film, and an upper electrode stacked in this order on the side of the substrate, the substrate comprising a gap formed in a region corresponding to the vibratory section to allow vibration of the vibratory section, wherein the piezoelectric film is a highly oriented crystal film comprising a solid solution of aluminum nitride and gallium nitride represented by a general formula $Al_{1-x}Ga_xN$ (additionally, 0<x<1) or a solid solution of aluminum nitride and indium nitride represented by a general formula $Al_{1-y}In_yN$ (additionally, 0<y<1).

In an aspect of the present invention, the upper electrode comprises a first electrode portion and a second electrode portion formed apart from each other.

In order to attain the above objects, according to the present invention, there is provided a thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a first piezoelectric film, an inner electrode, a second piezoelectric film, and an upper electrode stacked in this order on the side of the substrate, the substrate comprising a gap formed in a region corresponding to the vibratory section to allow vibration of the vibratory section, wherein each of the first piezoelectric film and the second piezoelectric film is a highly oriented crystal film comprising a solid solution of aluminum nitride and gallium nitride represented by a general formula $Al_{1-x}Ga_xN$ (additionally, $0<x<1$) or a solid solution of aluminum nitride and indium nitride represented by a general formula $Al_{1-y}In_yN$ (additionally, $0<y<1$).

In an aspect of the present invention, an insulating layer is formed between the substrate and the piezoelectric stacked structure, and the vibratory section also includes a part of the insulating layer. In an aspect of the present invention, the insulating layer is a dielectric film containing silicon oxide ($SiO_2$) which is a major component, a dielectric film containing silicon nitride ($SiN_x$) which is the major component, or a stacked film of the dielectric film containing silicon oxide which is the major component and the dielectric film containing silicon nitride which is the major component. Accordingly, while the high electromechanical coupling coefficient of the AlN-based thin film bulk acoustic resonator is maintained, the temperature coefficient of frequency is improved, and characteristics/performance can be stabilized.

In an aspect of the present invention, the substrate is made of a semiconductor or an insulator. In an aspect of the present invention, the substrate is made of a single crystal silicon.

In an aspect of the present invention, the piezoelectric film or the first piezoelectric film and the second piezoelectric film indicate a C-axis orientation, and full-width half maximum of a rocking curve of an X-ray diffraction peak of (0002) plane of the piezoelectric film or the first and second piezoelectric films is 3.0° or less.

In the present invention, a solid-solution thin film of aluminum nitride and gallium nitride or a solid-solution thin film of aluminum nitride and indium nitride is used as the piezoelectric film to match the lattice of the piezoelectric film with the metal crystal of the electrode layer. Therefore, orientation and crystallinity of the piezoelectric film are improved, and it is possible to obtain the piezoelectric film with large electromechanical coupling coefficient and high Q value. When the piezoelectric thin film having high orientation and crystallinity is used to prepare FBAR or SBAR, it is possible to realize high-performance FBAR or SBAR with low insertion loss, high gain, and superior in bandwidth, frequency-temperature characteristic and the like (e.g., electromechanical coupling coefficient $K_t^2$ obtained from measured values of a resonant frequency and antiresonant frequency in a range of 2.0 to 3.0 GHz is 4.5% or more).

Moreover, the present inventors have found that the orientation and crystallinity of the AlN thin film remarkably depends on those of the metal electrode film constituting the base film. The present inventors have also found that the resonance characteristic of the FBAR or SBAR including the piezoelectric AlN thin film constituted on the Si substrate largely depends on both properties of the metal thin film constituting the lower electrode, such as material, elasticity, orientation, and crystallinity, and properties of the AlN thin film, such as the orientation, crystallinity, and piezoelectricity. That is, a combination of the lower electrode composed of the metal thin film having high elasticity and orientation, and a c-axis orientated aluminum nitride thin film having the high orientation and crystallinity is optimized to control/enhance qualities of both films. It has been found that the electromechanical coupling coefficient and acoustic quality factor (Q value) of the thin film piezoelectric resonator accordingly increase and that the performance of the thin film piezoelectric resonator or the thin film piezoelectric filter is remarkably enhanced by the present invention. That is, the lower electrode is composed of two or more metal layers including a stacked structure of a first metal layer having a body-centered cubic structure and a second metal layer having a face-centered cubic structure, and the piezoelectric thin film composed of AlN is formed on the lower electrode. Accordingly, the orientation and crystallinity of the AlN thin film are improved. It has been found that the stacked structure obtained in this manner is used to constitute FBAR or SBAR and it is accordingly possible to realize the high-performance FBAR or SBAR with large electromechanical coupling coefficient, high Q value and superior in bandwidth, and frequency-temperature characteristic, and the present invention has been completed.

In order to attain the above objects, according to the present invention, there is provided an aluminum nitride thin film-metal electrode stacked structure comprising: a metal electrode; and an aluminum nitride thin film at least a part of which is formed on the metal electrode and which indicates a c-axis orientation, wherein the metal electrode comprises two or more metal layers including a stacked layer of a first metal layer having a body-centered cubic structure and a second metal layer having a face-centered cubic structure, and a thickness of the first metal layer is 0.5 times or more that of the metal electrode.

In an aspect of the present invention, the first metal layer is made of a metal selected from molybdenum, tungsten, an alloy mainly containing molybdenum, and an alloy mainly containing tungsten. In an aspect of the present invention, the second metal layer is made of a metal selected from iridium, platinum, gold, aluminum, silver, an alloy mainly containing iridium, an alloy mainly containing platinum, an alloy mainly containing gold, an alloy mainly containing aluminum, and an alloy mainly containing silver. In an aspect of the present invention, the aluminum nitride thin film is formed in contact with the first metal layer.

In an aspect of the present invention, an interface layer comprising a metal layer or a compound layer having a thickness of 0.1 time or less that of the metal electrode is formed between the aluminum nitride thin film and the first metal layer. In an aspect of the present invention, the interface layer is made of a metal or compound selected from aluminum, silicon, an alloy or compound mainly containing aluminum, and an alloy or compound mainly containing silicon.

In an aspect of the present invention, an adhesive metal layer is formed on the surface of the second metal layer on the side opposite to a side facing the first metal layer. In an aspect of the present invention, the adhesive metal layer is made of a metal selected from magnesium, titanium, vanadium, zirconium, hafnium, niobium, tantalum, chromium, nickel, an alloy mainly containing magnesium, an alloy mainly containing titanium, an alloy mainly containing vanadium, an alloy mainly containing zirconium, an alloy mainly containing hafnium, an alloy mainly containing niobium, an alloy mainly containing tantalum, an alloy mainly containing chromium, and an alloy mainly containing nickel.

In an aspect of the present invention, full-width half maximum (FWHM) of a rocking curve of (0002) diffraction peak of the aluminum nitride thin film is less than 3.3°. In an aspect of the present invention, full-width half maximum (FWHM) of a rocking curve of (110) diffraction peak of the first metal layer is less than 4.5°.

In order to attain the above objects, according to the present invention, there is provided a thin film piezoelectric resonator comprising: a piezoelectric thin film held between a plurality of electrodes, the piezoelectric thin film being bridged in a central part thereof with a peripheral part thereof used as a support, wherein the piezoelectric thin film and one of the electrodes comprise the above-mentioned aluminum nitride thin film-metal electrode stacked structure.

In order to attain the above objects, according to the present invention, there is provided a thin film piezoelectric resonator comprising: a substrate comprising a semiconductor or insulator including a vibration space; and a stacked structure in which a lower electrode, a piezoelectric thin film, and an upper electrode are stacked in this order in a position facing the vibration space of the substrate, wherein the piezoelectric thin film and the lower electrode comprise the above-mentioned aluminum nitride thin film-metal electrode stacked structure.

It is to be noted that the term "thin film piezoelectric resonator" has the same meaning as the term "thin film bulk acoustic resonator" in this description.

In an aspect of the present invention, the upper electrode comprises two electrode portions disposed apart from each other.

In order to attain the above objects, according to the present invention, there is provided a thin film piezoelectric resonator comprising: a substrate comprising a semiconductor or insulator including a vibration space; and a stacked structure in which a lower electrode, a first piezoelectric thin film, an inner electrode, a second piezoelectric thin film, and an upper electrode are stacked in this order in a position facing the vibration space of the substrate, wherein the first piezoelectric thin film and the lower electrode comprise the above-mentioned aluminum nitride thin film-metal electrode stacked structure.

In an aspect of the present invention, an insulating layer containing at least one layer of silicon oxide and/or silicon nitride which is a major component is attached to the stacked structure in the position facing the vibration space.

In an aspect of the present invention, the upper electrode or the inner electrode contains a metal selected from molybdenum, tungsten, niobium, aluminum, an alloy mainly containing molybdenum, an alloy mainly containing tungsten, an alloy mainly containing niobium, and an alloy mainly containing aluminum.

In an aspect of the present invention, the upper electrode or the inner electrode comprises a stacked layer of two or more types of metal layers each made of a metal selected from molybdenum, tungsten, niobium, an alloy mainly containing molybdenum, an alloy mainly containing tungsten, an alloy mainly containing niobium, iridium, platinum, gold, silver, an alloy mainly containing iridium, an alloy mainly containing platinum, an alloy mainly containing gold, an alloy mainly containing silver, magnesium, aluminum, titanium, vanadium, zirconium, hafnium, tantalum, chromium, nickel, an alloy mainly containing magnesium, an alloy mainly containing aluminum, an alloy mainly containing titanium, an alloy mainly containing vanadium, an alloy mainly containing zirconium, an alloy mainly containing hafnium, an alloy mainly containing tantalum, an alloy mainly containing chromium, and an alloy mainly containing nickel.

In the present invention, the AlN thin film is formed on the metal electrode composed of two or more metal thin films including a stacked layer of the first metal layer having the body-centered cubic structure and the second metal layer having the face-centered cubic structure to prepare an aluminum nitride thin film-metal electrode stacked structure. Typically, since the metal electrode is patterned in a predetermined shape, a part of the AlN thin film is formed on the silicon substrate or the insulating layer containing silicon oxide and/or silicon nitride which are the major components formed on the silicon substrate. To enhance the elasticity of the metal electrode, the thickness of the first metal layer having the body-centered cubic structure and having a higher elasticity needs to be 0.5 or more times a total thickness of the two or more metal thin films constituting the metal electrode.

In the metal having the face-centered cubic structure, since an atom density of a (111) plane is higher than that of a crystal plane of another orientation such as a (100) plane and (110) plane, the (111) plane exists as a crystal plane whose surface energy is small and which is thermodynamically stable. Therefore, in the metal with face-centered cubic structure, a thin film having a (111) orientation and high crystallinity is obtained, and therefore a rocking curve of a (111) diffraction peak which is an index of orientation evaluation of the crystal shows a steep peak, and full-width half maximum (FWHM) indicates a small value. Aluminum nitride formed in contact with the metal thin film having uniaxial orientation and high crystallinity easily grows as the thin film having uniaxial orientation and high crystallinity after all, and therefore a good-quality aluminum nitride thin film with small full-width half maximum (FWHM) of the rocking curve is obtained. However, the metals having the face-centered cubic structure, except iridium and alloys containing iridium which is major component, have a disadvantage that the elastic modulus is small. Iridium and the alloy containing iridium which is the major component are expensive, and have a problem that micro-fabrication is difficult.

On the other hand, in the metal with body-centered cubic structure, the atom density of the (110) plane is slightly higher than that of the crystal plane of the other orientation such as the (100) plane and (111) plane, and the (110) plane cannot necessarily steadily grow. Therefore, it is difficult for usual thin film forming method to obtain the thin film having the (110) orientation and high crystallinity, the rocking curve of the (110) diffraction peak which is an index of the orientation evaluation of the crystal becomes broad, and the full-width half maximum (FWHM) indicates a large value.

In the present invention, the thin film of the first metal with body-centered cubic structure is formed on the thin film of the second metal with face-centered cubic structure from which the thin film having uniaxial orientation and high crystallinity is easily obtained. Accordingly, it is possible to easily obtain the thin film of the first metal which has the body-centered cubic structure having the highly (110) oriented and high crystallinity. As the second metal of the face-centered cubic structure, it is preferable to use a metal selected from iridium, platinum, gold, aluminum, silver, an alloy mainly containing iridium, an alloy mainly containing platinum, an alloy mainly containing gold, an alloy mainly containing aluminum, and an alloy mainly containing silver. As the first metal with body-centered cubic structure, it is preferable to use high-elasticity metals whose elastic modulus is $2 \times 10^{11} N/m^2$ or more, such as molybdenum, tungsten, an alloy mainly containing molybdenum, and an alloy mainly containing tungsten. These metals with high elastic modulus have characteristics desirable as electrode materials for the thin film piezoelectric resonator. For example, a thermoelastic loss of molybdenum is smaller than about 1/56 of that of aluminum, and molybdenum is an especially preferable electrode material in this respect. Full-width half maximum (FWHM) of the rocking curve of (110) diffraction peak of the first metal layer prepared as described above is less than 4.5°, preferable 3.5° or less. The aluminum nitride thin film is formed in contact with the metal thin film having the body-centered cubic structure having the highly (110) oriented and high crystallinity, and it is therefore possible to easily grow the aluminum nitride thin film having uniaxial orientation and high crystallinity and whose full-width half maximum (FWHM) of the rocking curve of (0002) diffraction peak is less than 3.3°, preferably 2.5° or less. It is possible to obtain an aluminum nitride thin film-metal electrode stacked structure which is suitable for use in FBAR, SBAR and the like and which has superior characteristics.

Moreover, in the present invention, an interface layer composed of a metal layer or a compound layer having a thickness which is 0.1 or less times a total thickness of the metal electrode constituted by two or more metal thin films may be formed between the aluminum nitride thin film and the first metal layer having the body-centered cubic structure. Even in this case, in the same manner as described above, it is possible to easily grow the aluminum nitride thin film having uniaxial orientation and high crystallinity, and it is possible to obtain the aluminum nitride thin film-metal electrode stacked structure which is suitable for the use in FBAR, SBAR and the like and which has the superior characteristics. The metal layer or compound layer constituting the interface layer formed between the aluminum nitride thin film and the first metal layer with body-centered cubic structure is preferably composed of a metal or compound selected from aluminum, silicon, an alloy or compound mainly containing aluminum, and an alloy or compound mainly containing silicon.

The aluminum nitride thin film-metal electrode stacked structure of the present invention is typically formed on the substrate composed of a semiconductor or an insulator. Therefore, adhesion between the substrate and the metal electrode is important. To improve the adhesion between both, an adhesive metal layer is preferably disposed between the second metal layer with face-centered cubic structure and the substrate. As the metal for use in the adhesive metal layer, it is preferable to use a metal selected from magnesium, titanium, vanadium, zirconium, hafnium, niobium, tantalum, chromium, nickel, an alloy mainly containing magnesium, an alloy mainly containing titanium, an alloy mainly containing vanadium, an alloy mainly containing zirconium, an alloy mainly containing hafnium, an alloy mainly containing niobium, an alloy mainly containing tantalum, an alloy mainly containing chromium, and an alloy mainly containing nickel.

As in the stacked layer of the metal layer with body-centered cubic structure and the metal layer with face-centered cubic structure proposed in the present invention, crystal qualities such as the orientation and crystallinity of the aluminum nitride thin film is improved by growing aluminum nitride film on a multilayered metal thin film electrode in which two or more types of metal layers with different crystal structures are stacked. This attempt has not heretofore been made. Moreover, by a combination of the multilayered metal thin film and the aluminum nitride thin film, the quality of the piezoelectric thin film is enhanced to improve the performances of thin film piezoelectric devices such as the resonator and filter. This attempt has not heretofore been made.

According to the present invention, it is possible to obtain the high-performance thin film piezoelectric resonator whose electromechanical coupling coefficient $K_t^2$ obtained from the measured values of the resonant frequency and the antiresonant frequency in a range of 2.0 to 3.0 GHz is 4.5% or more, for example, 4.5 to 6.5%.

Moreover, in the thin film piezoelectric resonator of the present invention, the performance of the thin film piezoelectric resonator is further enhanced when the lower electrode is composed of two or more metal layers including the stacked layer of the first metal layer with body-centered cubic structure whose full-width half maximum (FWHM) of the rocking curve of (110) diffraction peak is less than 4.5° and the second metal layer with face-centered cubic structure, and the aluminum nitride (AlN) thin film indicates a c-axis orientation and its full-width half maximum (FWHM) of the rocking curve of (0002) diffraction peak is less than 3.3°.

Furthermore, in the thin film piezoelectric resonator of the present invention, the characteristics such as a temperature coefficient of frequency of the thin film piezoelectric resonator can further be improved when the stacked structure in which the lower electrode, piezoelectric thin film, and upper electrode are stacked in this order, or the stacked structure in which the lower electrode, first piezoelectric thin film, inner electrode, second piezoelectric thin film, and upper electrode are stacked in this order is formed on the insulating layer containing at least one layer of silicon oxide ($SiO_2$) and/or silicon nitride ($SiN_x$), which are the major components, in a position facing the vibration space.

BEST MODE FOR CARRYING OUT THE INVENTION

Embodiments of the present invention will hereinafter be described in detail.

Figure 1:
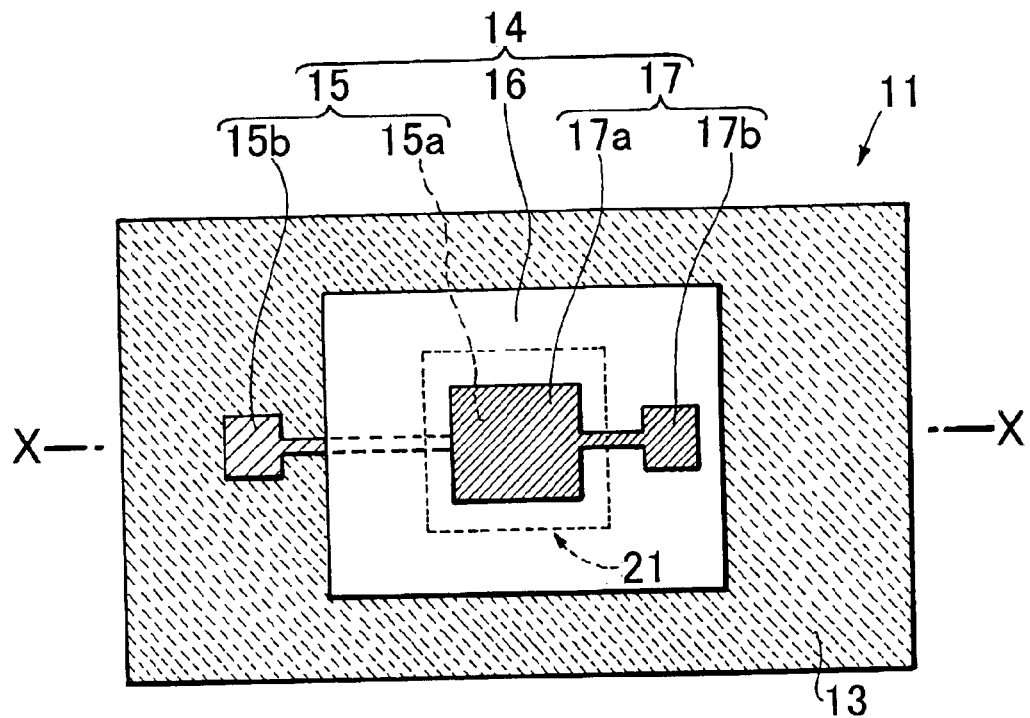
FIG. 1 is a schematic plan view showing an embodiment of a thin film bulk acoustic resonator according to the present invention.
Figure 2:
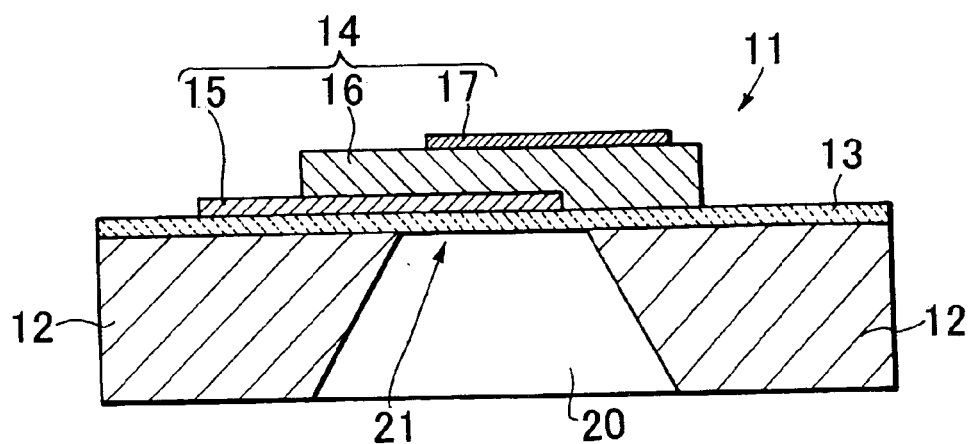
FIG. 2 is an X—X sectional view of FIG. 1.

FIG. 1 is a schematic plan view showing an embodiment of a thin film bulk acoustic resonator according to the present invention, and FIG. 2 is an X—X sectional view of FIG. 1. In these figures, a thin film bulk acoustic resonator 11 includes a substrate 12, a base film 13 composed of an insulating layer formed on the upper surface of the substrate 12, and a piezoelectric stacked structure 14 formed on the upper surface of the base film 13. The piezoelectric stacked structure 14 includes a lower electrode 15 formed on the upper surface of the base film 13, a piezoelectric film 16 formed on the upper surface of the base film 13 so as to cover a part of the lower electrode 15, and an upper electrode 17 formed on the upper surface of the piezoelectric film 16. A via hole 20 forming a gap is formed in the substrate 12. A part of the base film 13 is exposed to the via hole 20. The exposed portion of the base film 13, and the corresponding portion of the piezoelectric stacked structure 14 constitute a vibratory section (vibration diaphragm) 21. The lower electrode 15 and upper electrode 17 include main portions 15a, 17a formed in a region corresponding to the vibratory section 21, and terminal portions 15b, 17b for connecting the main portions 15a, 17a to an external circuit. The terminal portions 15b, 17b are positioned outside the region corresponding to the vibratory section 21.

As the substrate 12, it is possible to use a single crystal such as a Si (100) single crystal or a substrate in which polycrystalline films of silicon, diamond or the like are formed on the surface of a base member composed of a Si single crystal or the like. As the substrate 12, another semiconductor or further an insulator can also be used. Examples of a method for forming the via hole 20 in the substrate 12 include an anisotropic etching method from the lower surface side of a substrate. It is to be noted that the gap formed in the substrate 12 is not limited to the via hole 20, as long as vibration of the vibratory section 21 is permitted. A concave portion formed on the upper surface of the substrate at a region corresponding to the vibratory section 21 may also be used.

As the base film 13, for example, it is possible to use a dielectric film containing silicon oxide ($SiO_2$) as a major component, a dielectric film containing silicon nitride ($SiN_x$) as the major component, and a stacked film of the dielectric film containing silicon oxide as the major component and the dielectric film containing silicon nitride as the major component. For the material of the base film 13, the major component indicates a component whose content in the dielectric film is 50 equivalent % or more. The dielectric film may be composed of a single layer or a plurality of layers to which a layer for enhancing adhesion has been added. The base film 13 has a thickness, for example, of 0.2 to 2.0 μm. The examples of the method for forming the base film 13 include a thermal oxidation method of the surface of the substrate 12 of silicon and a CVD method.

As the lower electrode 15 and upper electrode 17, it is possible to use molybdenum (Mo), tungsten (W), a stacked film (Pt/Ti) of platinum (Pt) and titanium (Ti), aluminum (Al), a stacked film (Au/Cr) of gold (Au) and chromium (Cr), a stacked film (Au/Ti) of gold (Au) and titanium (Ti), and the like. Mo is preferable because of its low thermoelastic loss. For example, the thermoelastic loss of Mo is about 1/56 of that of Al. In addition to Mo alone, it is also possible to use Mo alloy, or to form the Mo electrode on an appropriate adhesive layer. The thickness of the lower electrode 15 and upper electrode 17 is, for example, 50 to 200 nm. Examples of the method for forming the lower electrode 15 and upper electrode 17 include a sputtering method and evaporation method. Furthermore, if necessary, a photolithography technique is used to carry out the patterning of electrodes to a required shape.

When the main portion 15a of the lower electrode 15 is extended into an opening through two sides of the opening of the via hole 20 having a rectangular shape in the upper surface of the substrate 12, it is possible to hold the vibratory section 21 by the lower electrode 15, and therefore it is also possible to omit the base film 13.

The piezoelectric film 16 is composed of an AlN film, and its thickness is, for example, 0.3 to 3.0 μm. The AlN film of the piezoelectric film 16 contains a third component including alkaline earth metals such as calcium, strontium, and barium or rare earth metal such as yttrium, europium, gadolinium, dysprosium, erbium, and ytterbium. The examples of the method for forming the piezoelectric film 16 includes a reactive sputtering method. Furthermore, if necessary, the photolithography technique is used to carry out the patterning of piezoelectric film to a required shape.

In general, the piezoelectric characteristics of the piezoelectric material depend on the degree of polarization, arrangement of polarization axes, and the like of the crystal. Even in the piezoelectric film of the thin film bulk acoustic resonator of the present invention, the piezoelectric characteristics are considered to depend on crystal properties such as a domain structure, orientation, and crystallinity of the crystal constituting the thin film. A single orientation film in the present description means a crystallized film whose targeted crystal plane is aligned in parallel with the surface of the substrate. For example, a (0001) single orientation film means a film whose (0001) plane grows in parallel with the film surface. Concretely, the film means that a reflection peak of a plane other than the targeted diffraction plane caused by the AlN crystal can hardly be detected, when an X-ray diffraction measurement is carried out by a diffractometer method. For example, in a (000L) single orientation film, that is, a C-axis single orientation film, with the X-ray diffraction measurement of θ–2θ rotation, a reflection strength of the plane other than a (000L) plane is less than 5%, preferably less than 2%, of a maximum peak strength of a (000L) plane reflection, more preferably not more than a detection limit. It is to be noted that the (000L) plane is a generic indication of planes of (0001) series, that is, equivalent planes such as a (0001) plane, (0002) plane, and (0004) plane.

The present inventors have studied a manner in which the resonance characteristics of FBAR constituted as shown in FIGS. 1 and 2 depend on composition or crystallinity of the AlN thin film. As a result, it has been found that the resonance characteristics of FBAR including the piezoelectric film composed of the AlN thin film largely depend on the composition or crystallinity of the AlN thin film. That is, to obtain excellent resonance characteristics, it is effective to add the alkaline earth metals such as calcium, strontium, and barium or the rare earth metals such as yttrium, europium, gadolinium, dysprosium, erbium, and ytterbium to the AlN thin film. The content is preferably 0.2 to 3.0 Atom %. When the content is less than 0.2 Atom %, an effect of resonance characteristic improvement by the addition of the third component is deteriorated. On the other hand, when the content exceeds 3.0 Atom %, the amount of the third component segregated in the crystal grain boundary increases, which bring about scattering of the acoustic wave, and there is a tendency to deterioration of the resonance characteristics.

The AlN thin film containing the alkaline earth metal or the rare earth metal indicates a C-axis orientation, and full-width half maximum (FWHM) of the rocking curve of (0002) diffraction peak measured by the X-ray diffraction method is 3.0° or less. When full-width half maximum (FWHM) of the rocking curve exceeds 3.0°, the electromechanical coupling coefficient $K_t^2$ drops, and the resonance characteristics tend to be deteriorated. Furthermore, when full-width half maximum (FWHM) of the rocking curve excessively increases, an electric current leak tends to be easily generated between the lower electrode terminal portion 15b and the upper electrode terminal portion 17b.

The C-axis length of the AlN thin film containing the alkaline earth metal or the rare earth metal is preferably 0.4978 to 0.4993 nm. When the C-axis length is smaller than 0.4978 nm or larger than 0.4993 nm, the electromechanical coupling coefficient $k_t^2$ and acoustic quality factor (Q value) decline, and the resonance characteristics tend to be deteriorated. Full-width half maximum (FWHM) of a 2θ rotation angle of the X-ray diffraction peak of (0002) plane measured by the diffractometer method is preferably 0.6° or less. When full-width half maximum (FWHM) of the 2θ rotation angle exceeds 0.6°, the electromechanical coupling coefficient $k_t^2$ and acoustic quality factor (Q value) likewise decline, and the resonance characteristics tend to be deteriorated.

Figure 3:
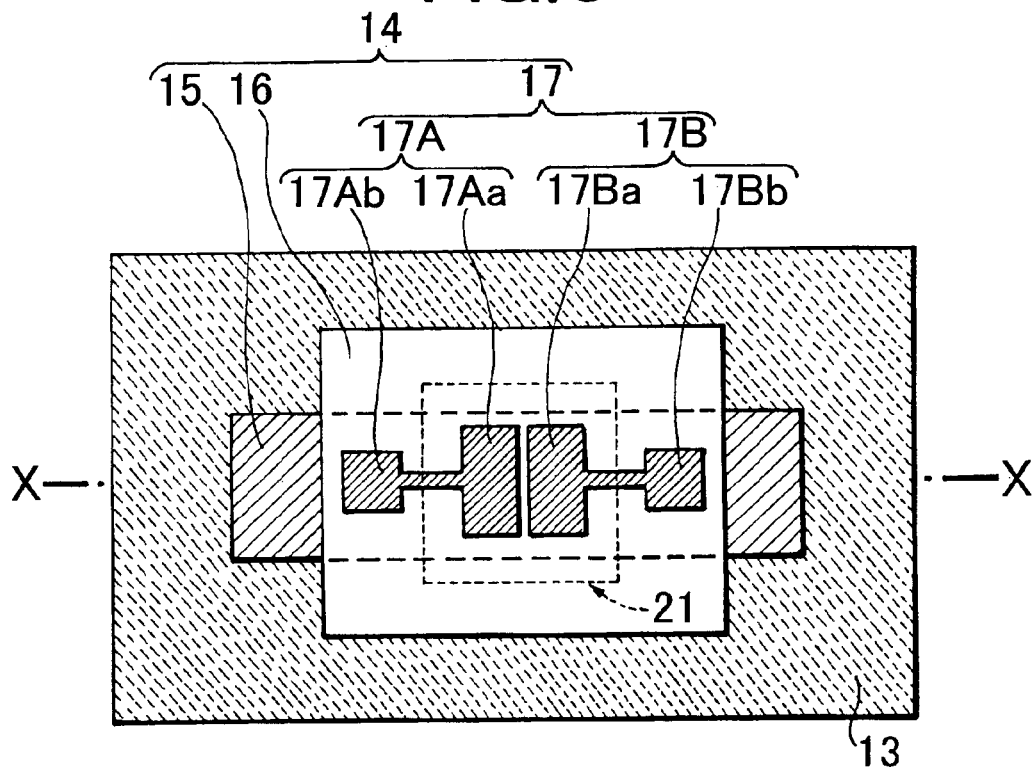
FIG. 3 is a schematic plan view showing an embodiment of the thin film bulk acoustic resonator according to the present invention.
Figure 4:
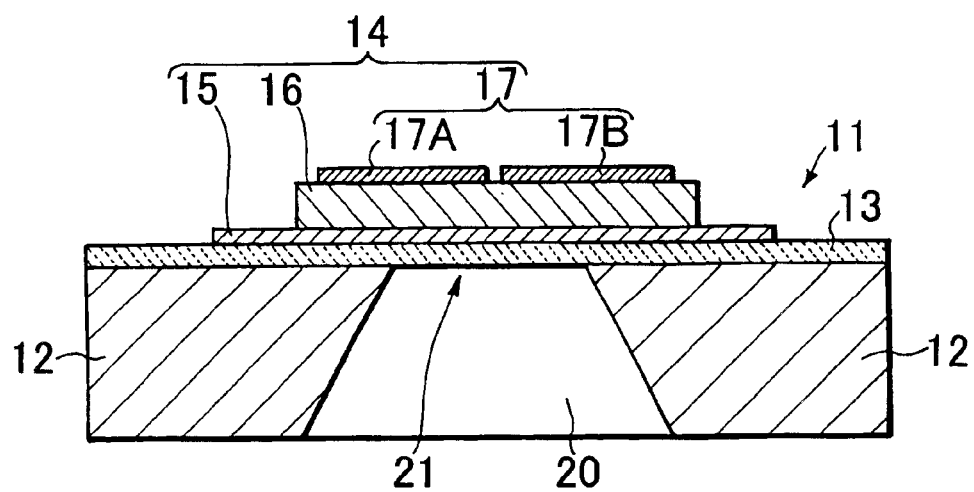
FIG. 4 is an X—X sectional view of FIG. 3.

FIG. 3 is a schematic plan view showing still another embodiment of the thin film bulk acoustic resonator according to the present invention, and FIG. 4 is an X—X sectional view of FIG. 3. In these figures, the members having functions similar to those of FIGS. 1 and 2 are denoted with the same reference numerals.

In the present embodiment, the lower electrode 15 is formed into a rectangular shape or a shape close thereto, and the upper electrode 17 includes a first electrode portion 17A and second electrode portion 17B. These electrode portions 17A, 17B include main portions 17Aa, 17Ba and terminal portions 17Ab, 17Bb. The main portions 17Aa, 17Ba are positioned in a region corresponding to the vibratory section 21, and the terminal portions 17Ab, 17Bb are positioned in a region other than the region corresponding to the vibratory section 21.

In the present embodiment, an input voltage is applied between one electrode portion of the upper electrode 17 (e.g., the second electrode portion 17B) and the lower electrode 15, and the voltage between the other electrode portion of the upper electrode 17 (e.g., the first electrode portion 17A) and the lower electrode 15 can be extracted as an output voltage. Therefore, a spurious component can sufficiently be reduced, and this can be used as the filter. When the filter constituted in this manner is used as a constituting element of a band-pass filter, a wiring in the device is unnecessary and frequency response of the filter is enhanced, because there is no loss caused by the wiring and attenuation characteristics of a stop band become excellent.

Next, another embodiment of the present invention will be described. The present embodiment includes the constitution shown in FIGS. 1 and 2. Additionally, the piezoelectric film 16 is composed of a solid solution of AlN and GaN or that of AlN and InN, and its thickness is, for example, 0.3 to 3.0 μm. The other constituting elements are similar to those described with reference to FIGS. 1 and 2. The examples of the method for forming the piezoelectric film 16 include the reactive sputtering method. Furthermore, if necessary, the photolithography technique is used to carry out the patterning of piezoelectric film to a required shape.

In general, the piezoelectric characteristics of the piezoelectric material depend on the degree of polarization, the arrangement of polarization axes, and the like, of the crystal. Even in the piezoelectric film of the thin film bulk acoustic resonator of the present invention, the piezoelectric characteristics are considered to depend on the crystal properties such as the domain structure, orientation, and crystallinity of the crystal constituting the thin film. The single orientation film in the present description means the crystallized film whose targeted crystal plane is aligned in parallel with the surface of the substrate. For example, the (0001) single orientation film means the film whose (0001) plane grows in parallel with the film surface. Concretely, the film means that the reflection peak of a plane other than the targeted diffraction plane can hardly be detected, when the X-ray diffraction measurement is carried out by the diffractometer method on a sample of the solid solution of AlN and GaN represented by a general formula $Al_{1-x}Ga_xN$ (additionally, 0<x<1) or a sample of the solid solution of AlN and InN represented by a general formula $Al_{1-y}In_yN$ (additionally, 0<y<1). For example, in the (000L) single orientation film, that is, the C-axis single orientation film, with the X-ray diffraction measurement of θ–2θ rotation, the reflection strength of the plane other than the (000L) plane is less than 5%, preferably less than 2%, of the maximum peak strength of the (000L) plane reflection, more preferably not more than the detection limit. It is to be noted that the (000L) plane is the generic indication of the planes of (0001) series, that is, the equivalent planes such as the (0001) plane, (0002) plane, and (0004) plane.

The present inventors have studied the manner in which the resonance characteristics of FBAR constituted as shown in FIGS. 1 and 2 depend on the composition or crystallinity of the AlN-based thin film. As a result, it has been found that the resonance characteristics of FBAR including the AlN-based piezoelectric film largely depend on the composition or crystallinity of the AlN-based thin film. That is, as the piezoelectric film, the solid solution of aluminum nitride and gallium nitride represented by the general formula $Al_{1-x}Ga_xN$ (additionally, 0<x<1) or that of aluminum nitride and indium nitride represented by $Al_{1-y}In_yN$ (additionally, 0<y<1) is used to get better lattice matching property of the piezoelectric film with the metal crystal of the electrode layer. This is effective for improving the performance of the thin film bulk acoustic resonator or the thin film bulk acoustic filter using the resonators. For the improvement of this performance, x and y are preferably set within ranges of 0<x<0.5 and 0<y<0.3, further preferably 0.03<x<0.35 and 0.01<y<0.15.

Among the above-described electrode materials, the crystal of Mo or W belongs to a body-centered cubic lattice represented by a space group $I_{m-3m}$, and that of Pt or Au belongs to a face-centered cubic lattice represented by a space group $F_{m-3m}$. The crystal of Mo or W with body-centered cubic lattice, formed by the sputtering method or evaporation method, indicates the (110) orientation, and the (110) plane grows in parallel with the film surface. On the other hand, the crystal of Pt or Au with face-centered cubic lattice, formed by the sputtering method or evaporation method, indicates the (111) orientation, and the (111) plane grows in parallel with the film surface. A lattice constant (a-axis length) of the Mo crystal is around 0.3147 nm, an interval between the (110) planes has a value around 0.2225 nm, the lattice constant (a-axis length) of the W crystal is around 0.3165 nm, and the interval between the (110) planes has a value around 0.2238 nm. The lattice constant (a-axis length) of the Pt crystal is around 0.3923 nm, the interval between the (110) planes on the (111) plane has a value around 0.2774 nm, the lattice constant (a-axis length) of the Au crystal is around 0.4079 nm, and the interval between the (110) planes on the (111) plane has a value around 0.2884 nm.

In the present invention, when the metal for use in the electrode layer is the Mo crystal, the W crystal or the like with body-centered cubic lattice, the lattice constants (i.e., the interval between the (100) planes) of these crystals are noted. A mismatch of the lattice length between the lattice constant (a-axis length) $L_{M100}$ of the electrode metal crystal and an a-axis length $L_{PZa}$ of an $Al_{1-x}Ga_xN$ (additionally, 0<x<1) based solid solution crystal or an $Al_{1-y}In_yN$ (additionally, 0<y<1) based solid solution crystal is represented by a parameter $100*(L_{M100}-L_{PZa})/L_{M100}[\%]$. On the other hand, when the metal for use in the electrode layer is the Pt crystal, Au crystal or the like with face-centered cubic lattice, the interval between the (110) planes on the (111) plane of these crystals is noted. The mismatch of a plane interval between a (110) plane interval $L_{M110}$ on the (111) plane of the electrode metal crystal and a (10—10) plane interval $L_{PZ1}$ of the $Al_{1-x}Ga_xN$ (additionally, 0<x<1) based solid solution crystal or the $Al_{1-y}In_yN$ (additionally, 0<y<1) based solid solution crystal is represented by a parameter $100*(L_{M110}-L_{PZ1})/L_{M110}[\%]$. A matching property of an atomic arrangement of the Mo crystal, the W crystal or the like with body-centered cubic lattice in the (110) plane with that of the $Al_{1-x}Ga_xN$ (additionally, 0<x<1) based solid solution crystal or the $Al_{1-y}In_yN$ (additionally, 0<y<1) based solid solution crystal in the (0001) plane is not very good. Therefore, the mismatch $100*(L_{M100}-L_{PZa})/L_{M100}-[\%]$ of the lattice length between the crystal of Mo, W or the like and the $Al_{1-x}Ga_xN$ (additionally, 0<x<1) based solid solution crystal or $Al_{1-y}In_yN$ (additionally, 0<y<1) based solid solution crystal is preferably 1.0% or less. On the other hand, the matching property of the atomic arrangement of the crystal of Pt, Au or the like with face-centered cubic lattice in the (111) plane with that of the $Al_{1-x}Ga_xN$ (additionally, 0<x<1) based solid solution crystal or the $Al_{1-y}In_yN$ (additionally, 0<y<1) based solid solution crystal in the (0001) plane is relatively excellent. Therefore, the mismatch $100*(L_{M110}-L_{PZ1})/L_{M110}$ of the lattice length between the crystal of Pt, Au or the like and the $Al_{1-x}Ga_xN$ (additionally, 0<x<1) based solid solution crystal or $Al_{1-y}In_yN$ (additionally, 0<y<1) based solid solution crystal is preferably 2.6% or less. When the mismatch $100*(L_{M100}-L_{PZa})/L_{M100}$ of the lattice length concerning the body-centered cubic lattice such as the crystal of Mo, W or the like exceeds 1.0%, the lattice matching property between the metal crystal and the $Al_{1-x}Ga_xN$ (additionally, 0<x<1) based solid solution or $Al_{1-y}In_yN$ (additionally, 0<y<1) based solid solution is deteriorated. The orientation and crystallinity of the AlN-GaN based or AlN-InN based piezoelectric thin film are deteriorated. As a result, the electromechanical coupling coefficient $k_t^2$ and acoustic quality factor (Q value) decrease, and the performance of the thin film bulk acoustic resonator or the thin film filter tends to be deteriorated. Similarly, when the mismatch $100*(L_{M110}-L_{PZ1})/L_{M110}$ of the lattice length concerning the face-centered cubic lattice such as the crystal of Pt, Au or the like exceeds 2.6%, the lattice matching property between the metal crystal and the $Al_{1-x}Ga_xN$ (additionally, 0<x<1) based solid solution or $Al_{1-y}In_yN$ (additionally, 0<y<1) based solid solution is deteriorated. The orientation and crystallinity of the AlN-GaN based or AlN-InN based piezoelectric thin film are deteriorated. As a result, the electromechanical coupling coefficient $k_t^2$ and acoustic quality factor (Q value) decrease, and the perfor-mance of the thin film bulk acoustic resonator or the thin film filter tends to be deteriorated.

The $Al_{1-x}Ga_xN$ (additionally, 0<x<1) based solid solution thin film or the $Al_{1-y}In_yN$ (additionally, 0<y<1) based solid solution thin film indicates a c-axis orientation, and full-width half maximum (FWHM) of the rocking curve of (0002) diffraction peak measured by the X-ray diffraction method is preferably 3.0° or less. When full-width half maximum (FWHM) of the rocking curve exceeds 3.0°, the electromechanical coupling coefficient $k_t^2$ drops, and the resonance characteristics tend to be deteriorated. Furthermore, when full-width half maximum (FWHM) of the rocking curve excessively increases, the electric current leak tends to be easily generated between the lower electrode terminal portion 15b and the upper electrode terminal portion 17b.

Next, another embodiment of the present invention will be described. The present embodiment includes the constitution shown in FIGS. 3 and 4. Additionally, the piezoelectric film 16 is composed of the solid solution of AlN and GaN or that of AlN and InN as described above, and its thickness is, for example, 0.3 to 3.0 μm. The other constituting elements are similar to those described with reference to FIGS. 3 and 4.

Figure 5:
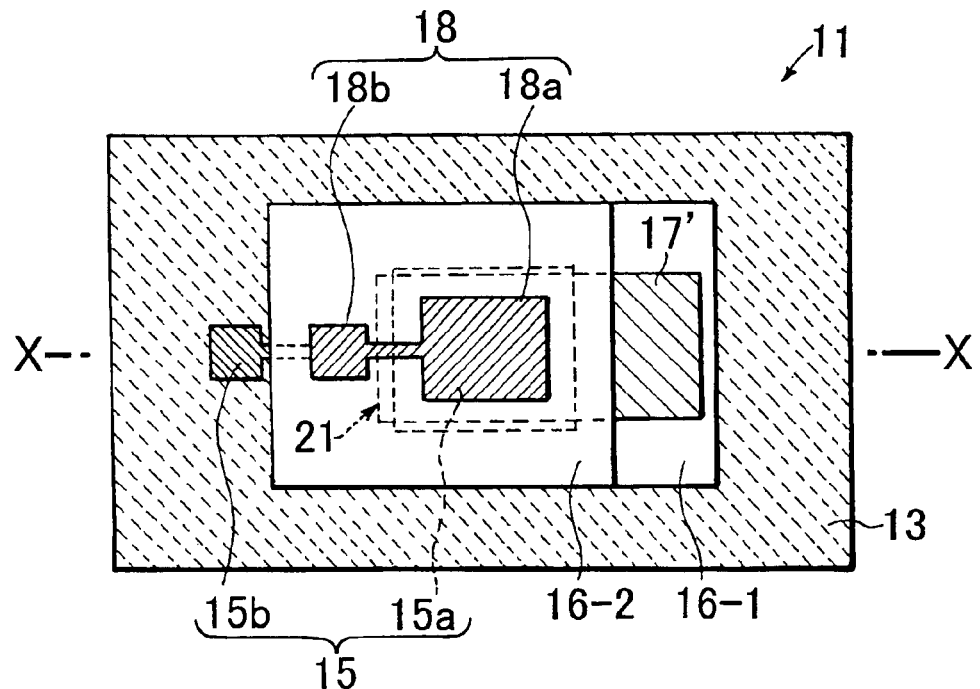
FIG. 5 is a schematic plan view showing an embodiment of a thin film piezoelectric resonator according to the present invention.
Figure 6:
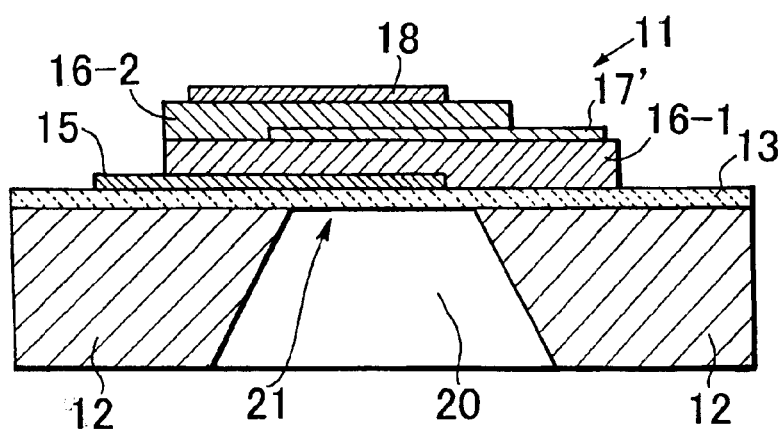
FIG. 6 is an X—X sectional view of FIG. 5.

FIG. 5 is a schematic plan view showing still another embodiment of the thin film bulk acoustic resonator according to the present invention, and FIG. 6 is an X—X sectional view of FIG. 5. In these figures, the members having the functions similar to those of FIGS. 1 to 4 are denoted with the same reference numerals.

In the present embodiment, stacked thin film bulk acoustic resonators and filters or stacked thin film bulk acoustic wave resonators and filters include a piezoelectric stacked structure corresponding to a stack of two piezoelectric stacked structures each of which is used in the above-described embodiment. That is, on the base film 13, the lower electrode 15, a first piezoelectric film 16-1, an inner electrode 17', a second piezoelectric film 16-2, and an upper electrode 18 are stacked/formed in this order. The inner electrode 17' has a function of the upper electrode with respect to the first piezoelectric film 16-1 and that of the lower electrode with respect to the second piezoelectric film 16-2. The first piezoelectric film 16-1 and second piezoelectric film 16-2 is made of the solid solution of AlN and GaN or that of AlN and InN as described above, and their thickness is, for example, 0.3 to 3.0 μm.

In the present embodiment, since the input voltage is applied between the lower electrode 15 and inner electrode 17', and the voltage between the inner electrode 17' and upper electrode 18 can be extracted as the output voltage, this can be used as a multi-polar filter. When this multi-polar filter is used as a constituting element of the band-pass filter, the frequency response performance of the filter is enhanced because the attenuation characteristics in the stop band become excellent.

Figure 7:
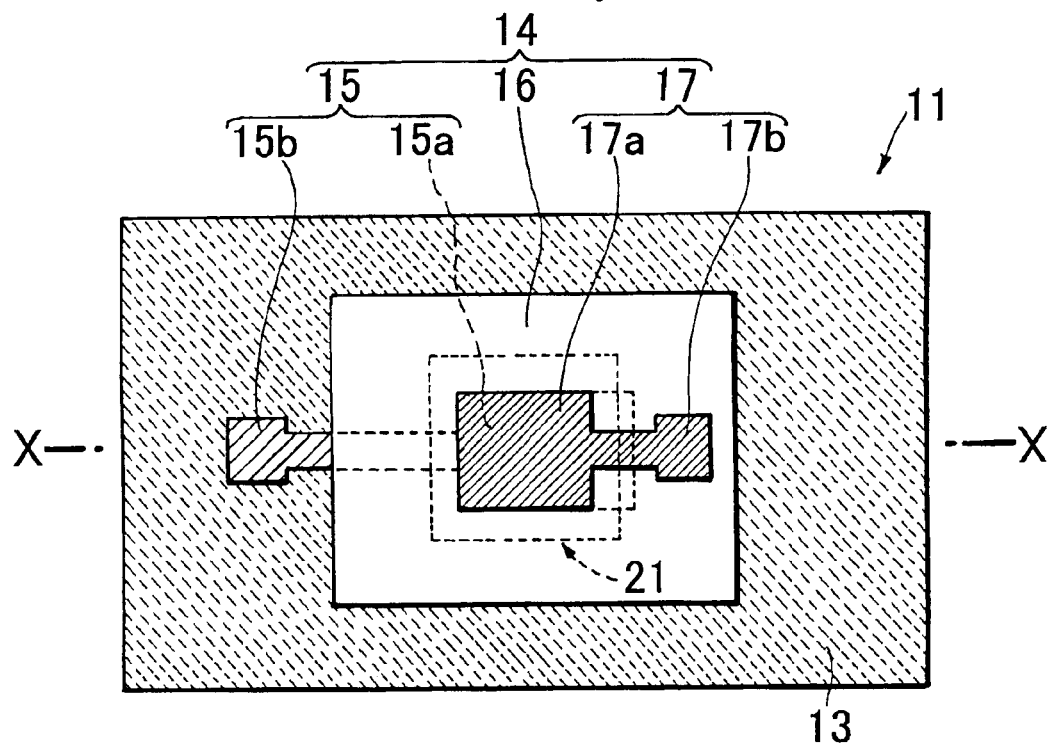
FIG. 7 is a schematic plan view showing an embodiment of the thin film piezoelectric resonator according to the present invention.
Figure 8:
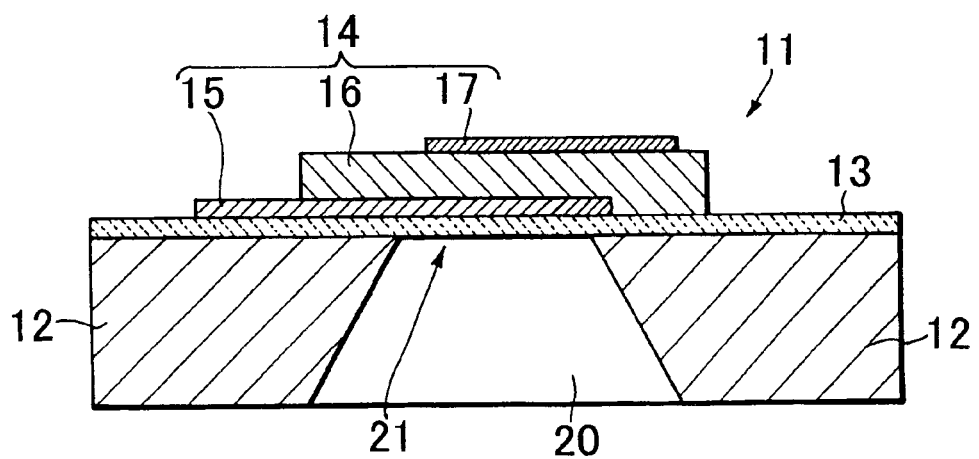
FIG. 8 is an X—X sectional view of FIG. 7.

Next, still another embodiment of the present invention will be described. FIG. 7 is a schematic plan view showing the embodiment of the thin film piezoelectric resonator according to the present invention, and FIG. 8 is an X—X sectional view of FIG. 7. In these figures, the thin film piezoelectric resonator 11 includes the substrate 12, the insulating layer 13 formed on the upper surface of the substrate 12, and the piezoelectric stacked structure 14 formed on the upper surface of the insulating layer 13. The piezoelectric stacked structure 14 includes the lower electrode 15 formed on the upper surface of the insulating layer 13, the piezoelectric thin film 16 formed on the upper surface of the insulating layer 13 so as to cover a part of the lower electrode 15, and the upper electrode 17 formed on the upper surface of the piezoelectric thin film 16. The via hole 20 forming the gap is fabricated in the substrate 12. A part of the insulating layer 13 is exposed to the via hole 20. The exposed portion of the insulating layer 13, and the corresponding portion of the piezoelectric stacked structure 14 constitute the vibratory section (vibration diaphragm) 21. The lower electrode 15 and upper electrode 17 include the main portions 15a, 17a formed in the region corresponding to the vibratory section 21, and the terminal portions 15b, 17b for connecting the main portions 15a, 17a to the external circuit. The terminal portions 15b, 17b are positioned outside the region corresponding to the vibratory section 21.

As the substrate 12, it is possible to use a single crystal such as a Si (100) single crystal or a substrate in which polycrystalline films of silicon, diamond or the like are formed on the surface of a base member composed of a Si single crystal or the like. As the substrate 12, another semiconductor or further an insulator can also be used. Examples of a method for forming the via hole 20 in the substrate 12 include an anisotropic etching method from the lower surface side of the substrate. It is to be noted that the gap formed in the substrate 12 is not limited to the via hole 20, as long as vibration of the vibratory section 21 is permitted. A concave portion formed on the upper surface of the substrate at a region corresponding to the vibratory section 21 may also be used.

As the insulating layer 13, for example, it is possible to use the dielectric film containing silicon oxide ($SiO_2$) as the major component, the dielectric film containing silicon nitride ($SiN_x$) as the major component, and the stacked film of the dielectric film containing silicon oxide as the major component and the dielectric film containing silicon nitride as the major component. For the material of the insulating layer 13, the major component indicates the component whose content in the layer is 50 equivalent % or more (this also applies to the materials of the other layer). The dielectric film may also be composed of the single layer or the plurality of layers to which the layer for enhancing the adhesion has been added. The insulating layer 13 has a thickness, for example, of less than 2.0 $\mu$m, preferably 0.5 $\mu$m or less. The examples of the method for forming the insulating layer 13 include the thermal oxidation method of the surface of the substrate 12 of silicon and the CVD method. In the present invention, a structure can also be used in which a portion of the insulating layer 13 corresponding to the vibratory section 21 is removed by the etching and in which the lower electrode 15 is exposed to the via hole 20. Since the portion of the insulating layer 13 corresponding to the vibratory section 21 are all removed in this manner, there is an advantage that the acoustic quality factor (Q value) becomes the higher value whereas the temperature characteristics of the resonant frequency are slightly deteriorated.

The lower electrode 15 is composed by stacking the first metal layer with body-centered cubic structure on the second metal layer with face-centered cubic structure, and further the adhesive metal layer is formed between the second metal layer and the substrate 12 if necessary, and its thickness is, for example, 50 to 300 nm. The piezoelectric thin film 16 is formed of AlN, and its thickness is, for example, 0.5 to 3.0 $\mu$m. For example, the upper electrode 17 contains the metal selected from molybdenum, tungsten, niobium, aluminum, an alloy mainly containing molybdenum, an alloy mainly containing tungsten, an alloy mainly containing niobium, and an alloy mainly containing aluminum. Alternatively, the upper electrode 17 contains two or more types of stacked layers each composed of the metal selected from molybdenum, tungsten, niobium, an alloy mainly containing molybdenum, an alloy mainly containing tungsten, an alloy mainly containing niobium, iridium, platinum, gold, silver, an alloy mainly containing iridium, an alloy mainly containing platinum, an alloy mainly containing gold, an alloy mainly containing silver, magnesium, aluminum, titanium, vanadium, zirconium, hafnium, tantalum, chromium, nickel, an alloy mainly containing magnesium, an alloy mainly containing aluminum, an alloy mainly containing titanium, an alloy mainly containing vanadium, an alloy mainly containing zirconium, an alloy mainly containing hafnium, an alloy mainly containing tantalum, an alloy mainly containing chromium, and an alloy mainly containing nickel. The thickness of the upper electrode 17 is, for example, 50 to 300 nm.

In general, the piezoelectric characteristics of the piezoelectric material depend on the degree of polarization, the arrangement of polarization axes, and the like of the crystal. Even in the piezoelectric thin film for use in the present invention, the piezoelectric characteristics are considered to depend on the crystal properties such as the domain structure, orientation, and crystallinity of the crystal constituting the thin film. The single orientation film in the present description means the crystallized film whose targeted crystal plane is aligned in parallel with the surface of the substrate. For example, the (0001) single orientation film means the film whose (0001) plane grows in parallel with the film surface. Concretely, the film means that the reflection peak of the plane other than the targeted diffraction plane caused by the AlN crystal can hardly be detected, when the X-ray diffraction measurement is carried out by the diffractometer method. For example, in the (000L) single orientation film, that is, the c-axis single orientation film, with the X-ray diffraction measurement of $\theta$–$2\theta$ rotation, the reflection strength of the plane other than the (000L) plane is less than 5%, preferably less than 2%, of the maximum peak strength of the (000L) plane reflection, more preferably not more than the detection limit. It is to be noted that the (000L) plane is the generic indication of the planes of (0001) series, that is, the equivalent planes such as the (0001) plane, (0002) plane, and (0004) plane.

The present inventors have studied the manner in which the resonance characteristics of FBAR constituted as shown in FIGS. 7 and 8 depend on both the properties such as the material, elasticity, orientation, and crystallinity of the multi-layered metal thin film constituting the electrode and the properties such as the orientation and crystallinity of the AlN thin film. In the shown FBAR, the lower electrode 15 is constituted by stacking the adhesive metal layer formed in contact with the substrate 12 if necessary, the second metal layer with face-centered cubic structure, and the first metal layer with body-centered cubic structure in this order.

When preparing the lower electrode 15, after forming the adhesive metal layer, the second metal layer with face-centered cubic structure, and first metal layer with body-centered cubic structure in this order by the sputtering method or evaporation method, these metal layers are patterned in the predetermined shapes by dry etching. For the AlN thin film 16, after forming the film by the reactive sputtering method on the upper surface of the substrate 12 on which the lower electrode 15 has been formed, the photolithography technique was used to etch/remove a portion of the film at a region other than a region on the via hole 20 to process the film into a specified shape. At this time, even when another metal or compound layer having a thickness of 0.1 time or less the total thickness of two or more metal layers constituting the lower electrode 15 is formed between the AlN thin film 16 and the first metal layer with body-centered cubic structure, the object of the present invention is achieved. The upper electrode 17 was formed on the AlN thin film 16 remaining on the via hole 20. The upper electrode 17 was formed in a shape close to the rectangular shape.

The present inventors have found that the thin film of the metal with face-centered cubic structure, from which highly oriented thin film is easily obtained, and the thin film of the high-elasticity metal having an elastic modulus of $2 \times 10^{11} \text{N}/\text{m}^2$ or more are stacked to form a uniaxial orientation and high-elasticity stacked metal thin film having full-width half maximum (FWHM) of the rocking curve of the specific diffraction peak derived from the high-elasticity metal of less than 4.5°. It has also been found that when the aluminum nitride thin film is allowed to grow on the above stacked metal thin film, it is possible to prepare a high-crystallinity c-axis oriented aluminum nitride thin film having full-width half maximum (FWHM) of the rocking curve of (0002) diffraction peak of less than 3.3°.

The examples of the preferable material of the first metal layer with body-centered cubic structure (space group $I_{m\text{-}3m}$) for use in the lower electrode 15 include molybdenum, tungsten, an alloy mainly containing molybdenum, and an alloy mainly containing tungsten. These materials indicate the (110) orientation, and the (110) plane grows in parallel with the film surface. These materials have a characteristic that the thermoelastic loss is low. The examples of the alloy mainly containing molybdenum (Mo) include a TZM alloy having a composition of 99.38% Mo—0.5% Ti—0.07% Zr—0.05% C, a 95% Mo—5% Re alloy, and 90% Mo—10% W alloy. The examples of the alloy mainly containing tungsten (W) include a 95% W—5% Re alloy, a 90% W—10% Mo alloy, and a W—Cu—Ni alloy.

The preferable materials of the second metal layer with face-centered cubic structure (space group $F_{m\text{-}3m}$) for use in the lower electrode 15 are iridium, platinum, gold, aluminum, silver, an alloy mainly containing iridium, an alloy mainly containing platinum, an alloy mainly containing gold, an alloy mainly containing aluminum, an alloy mainly containing silver, and the like, these materials indicate the (111) orientation, and the (111) plane grows in parallel with the film surface. The examples of the alloy mainly containing iridium (Ir) include an Ir—Pt alloy. The examples of the alloy mainly containing platinum (Pt) include an alloy of Pt with the metal selected from Rh, Ir, Ru, Pd, Au, Ni, and W. The examples of the alloy mainly containing gold (Au) include an alloy of Au with the metal selected from Pd, Pt, Fe, Ni, Cu, and Ag. The examples of the alloy mainly containing aluminum (Al) include an Al—Si—Cu based alloy in which a small amount of Si and Cu is added or dissolved into Al, an Al—Si based alloy, an alloy in which a small amount of Mo and W is dissolved into Al, an Al—Cu—Mg—Mn based alloy, an Al—Cu—Mg—Ni based alloy, an Al—Mg based alloy, an Al—Zn—Mg based alloy, and the like. The examples of the alloy mainly containing silver (Ag) include an alloy of Ag with the metal selected from Zn, Al, Au, Sn, and Cu.

The preferable materials for use as the layer (interface layer) of another metal or compound formed between the AlN thin film 16 and the first metal layer with body-centered cubic structure are aluminum, silicon, an alloy or compound mainly containing aluminum, and an alloy or compound mainly containing silicon. The examples of the alloy mainly containing aluminum (Al) include the above-described Al—Si—Cu based alloy, Al—Si based alloy, Al—Mo—W based alloy, Al—Cu—Mg—Mn based alloy, Al—Cu—Mg—Ni based alloy, Al—Mg based alloy, Al—Zn—Mg based alloy, and the like. The examples of the compound mainly containing aluminum (Al) include $AlO_xN_y$. The examples of the compound mainly containing silicon (Si) include $Si_3N_4$, $SiN_x$, $SiO_xN_y$, $SiO_2$, and the like.

The preferable materials for use as the adhesive metal layer formed between the substrate 12 and the second metal layer with face-centered cubic structure are magnesium, titanium, vanadium, zirconium, hafnium, niobium, tantalum, chromium, nickel, an alloy mainly containing magnesium, an alloy mainly containing titanium, an alloy mainly containing vanadium, an alloy mainly containing zirconium, an alloy mainly containing hafnium, an alloy mainly containing niobium, an alloy mainly containing tantalum, an alloy mainly containing chromium, an alloy mainly containing nickel, and the like. As the alloy mainly containing magnesium (Mg), there are an Mg—Al—Zn—Mn alloy, Mg—Zn—Zr alloy, Mg-rare earth element based alloy, and the like. As the alloy mainly containing titanium (Ti), there are an alloy of Ti with the metal selected from Al, Mo, V, Cr, Mn, and Fe, and the like. As the alloy mainly containing niobium (Nb), there are an Nb—Si—Ti—Fe alloy, and the like. As the alloy mainly containing tantalum (Ta), there are an alloy of Ta with the metal selected from Cr, Fe, Co, Ni, W, and Pt, and the like. As the alloy mainly containing chromium (Cr), there are an alloy of Cr with the metal selected from Fe, Co, Ni, and Mo, and the like. As the alloy mainly containing nickel (Ni), there are an alloy of Ni with the metal selected from Al, Si, Cr, Mn, Fe, Cu, and Mo, and the like.

The materials as the metals for use in the upper electrode 17 are molybdenum, tungsten, niobium, aluminum, an alloy mainly containing molybdenum, an alloy mainly containing tungsten, an alloy mainly containing niobium, an alloy mainly containing aluminum, and the like. Regarding the upper electrode 17, the characteristics of the electrode can be stabilized with the use of the electrode composed of the stacked metal thin film including two or more layers each made of the metal selected from molybdenum, tungsten, niobium, the alloy mainly containing molybdenum, the alloy mainly containing tungsten, the alloy mainly containing niobium, iridium, platinum, gold, silver, the alloy mainly containing iridium, the alloy mainly containing platinum, the alloy mainly containing gold, the alloy mainly containing silver, magnesium, aluminum, titanium, vanadium, zirconium, hafnium, tantalum, chromium, nickel, the alloy mainly containing magnesium, the alloy mainly containing aluminum, the alloy mainly containing titanium, the alloy mainly containing vanadium, the alloy mainly containing zirconium, the alloy mainly containing hafnium, the alloy mainly containing tantalum, the alloy mainly containing chromium, and the alloy mainly containing nickel.

For the c-axis orientation aluminum nitride thin film formed on the stacked metal thin film of two or more layers including a stack of the first metal layer with body-centered cubic structure and the second metal layer with face-centered cubic structure, full-width half maximum (FWHM) of the rocking curve of (0002) diffraction peak measured by the X-ray diffraction is less than 3.3°. When full-width half maximum (FWHM) of the rocking curve is 3.3° or more, the electromechanical coupling coefficient $k_t^2$ and the acoustic quality factor (Q value) drop, and the resonance characteristics are unfavorably deteriorated. Furthermore, when full-width half maximum (FWHM) of the rocking curve excessively increases, the electric current leak tends to be easily generated between the lower electrode terminal portion 15b and the lower electrode terminal portion 17b.

It is to be noted that in the thin film piezoelectric resonator constituted as shown in FIGS. 7 and 8, an electric field is applied to the upper and lower electrodes attached to the piezoelectric thin film to carry out a polarization treatment in a thickness direction, and a bulk wave is accordingly excited. Therefore, a part of the lower electrode needs to be exposed to constitute the lower electrode as a terminal electrode. This constitution is used only as the resonator, and to constitute the filter, two or more devices need to be combined.

Another embodiment of the present invention includes the constitution shown in FIGS. 3 and 4. Additionally, the substrate 12, the insulating layer 13, and the lower electrode 15, piezoelectric thin film 16 and upper electrode 17 (17A, 17B) constituting the piezoelectric stacked structure 14 are similar to those described with reference to FIGS. 7 and 8.

Figure 9:
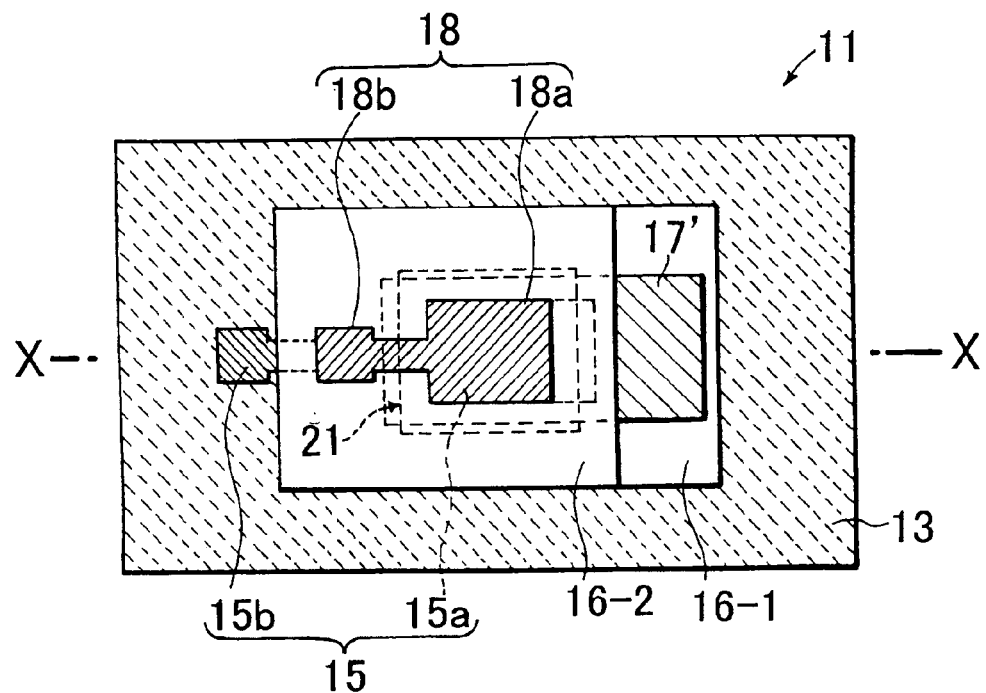
FIG. 9 is a schematic plan view showing an embodiment of the thin film piezoelectric resonator according to the present invention.
Figure 10:
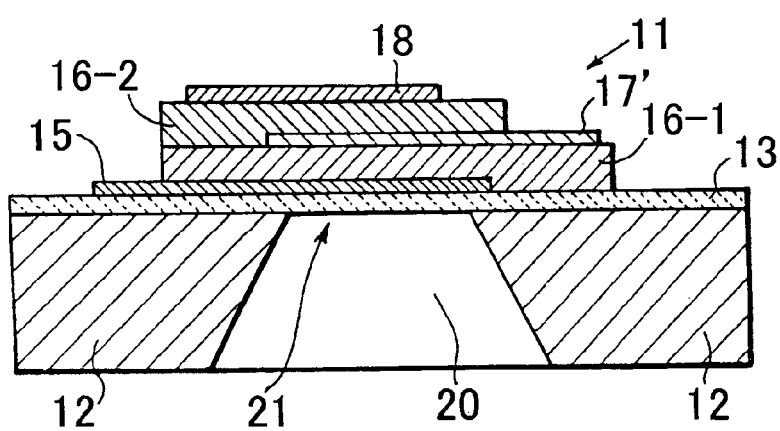
FIG. 10 is an X—X sectional view of FIG. 9.

FIG. 9 is a schematic plan view showing still another embodiment of the thin film piezoelectric resonator according to the present invention, and FIG. 10 is the X—X sectional view of FIG. 9. In these figures, the members having the functions similar to those in FIGS. 7 and 8 are denoted with the same reference numerals.

In the present embodiment, a stacked thin film bulk acoustic resonator includes a piezoelectric stacked structure corresponding to a stack of two stacked piezoelectric structures each being used in the embodiment described with reference to FIGS. 7 and 8. That is, on the insulating layer 13, the lower electrode 15, first piezoelectric thin film 16-1, inner electrode 17', second piezoelectric thin film 16-2, and upper electrode 18 are stacked/formed in this order. The inner electrode 17' has the function of the upper electrode with respect to the first piezoelectric thin film 16-1, and that of the lower electrode with respect to the second piezoelectric thin film 16-2.

In the present embodiment, since the input voltage is applied between the lower electrode 15 and inner electrode 17', and the voltage between the inner electrode 17' and upper electrode 18 can be extracted as the output voltage, this can be used as the multi-polar filter. When the multi-polar filter constituted in this manner is used as the constituting element of the band-pass filter, the wiring in the device is unnecessary and the frequency response of the filter is enhanced, because there is not any loss caused by the wiring and the attenuation characteristics in the stop band become excellent.

In the thin film piezoelectric resonator (thin film bulk acoustic resonator) described above, the following relations are present among a resonant frequency $f_r$, antiresonant frequency $f_a$, and electromechanical coupling coefficient $k_t^2$ in impedance characteristics measured using a micro wave probe:

$k_t^2 = \phi_r/\mathrm{Tan}(\phi_r)$; and $\phi_r = (\pi/2)\,(f_r/f_a)$.

For the sake of simplicity, the electromechanical coupling coefficient $k_t^2$ calculated from the following equation can be used, and in the present description, a numeric value of the electromechanical coupling coefficient $k_t^2$ is calculated using the following equation.

$k_t^2 = 4.8(f_a - f_r)/(f_a + f_r)$

In the FBAR or SBAR having each constitution shown in FIGS. 1 and 2, FIGS. 3 and 4, FIGS. 5 and 6, FIGS. 7 and 8, and FIGS. 9 and 10, the electromechanical coupling coefficient $k_t^2$ obtained from the measured values of the resonant frequency and antiresonant frequency in a range of 2.0 to 3.0 GHz is preferably 4.5% or more, for example, 4.5 to 6.5%. When the electromechanical coupling coefficient $k_t^2$ is less than 4.5%, the bandwidth of the prepared FBAR or SBAR is reduced, and it tends to be difficult to practically use the thin film piezoelectric resonator in a high-frequency band.

Examples and comparative examples will hereinafter be described, and the present invention will be described in further detail.

EXAMPLE 1

In the present example, the thin film bulk acoustic resonator having the structure shown in FIGS. 1, 2 was prepared as follows.

That is, a silicon nitride ($SiN_x$) layer having a thickness of 0.55 μm was formed on the upper and lower surfaces of the (100) Si substrate 12 having a thickness of 250 μm by a low-pressure CVD method. The $SiN_x$ layer on the upper surface was formed as the base film 13. Moreover, the $SiN_x$ layer on the lower surface was formed in a pattern of a mask for forming the via hole described later with respect to the substrate 12.

A Mo layer having a thickness of 200 nm was formed on the surface of the base film 13 by a DC magnetron sputtering method, and patterned by photolithography to form the lower electrode 15. The main portion 15a of the lower electrode 15 was formed in the shape close to a rectangular shape having a plane dimension of 140×160 μm. It was confirmed by X-ray diffraction measurement that the lower electrode 15 was the single orientation film. A 1.55 μm thick AlN thin film containing the third component whose composition is shown in Table 1 was formed on the Mo lower electrode 15. The AlN thin film was formed using a reactive RF magnetron sputtering method using a target of an Al alloy having an appropriate composition or a target of metal Al partially including a buried rare earth metal bulk. The AlN thin film was patterned in a predetermined shape to form the piezoelectric film 16 by a wet etching using hot phosphoric acid. Thereafter, the DC magnetron sputtering method and lift-off method were used to form the Mo upper electrode 17 having a thickness of 200 nm. The main portion 17A of the upper electrode 17 was formed in the shape close to the rectangular shape having a plane dimension of 140× 160 μm, and was disposed in a position corresponding to the lower electrode main portion 15a.

Next, the side of the stacked structure obtained as described above, on which the upper and lower electrodes 15, 17 and piezoelectric film 16 were formed, was coated with a PMMA resin, and the via hole 20 constituting the gap was formed by etching and removing the portion of the Si substrate 12 corresponding to the vibratory section 21 with KOH aqueous solution, using a patterned $SiN_x$ layer formed on the lower surface of the Si substrate 12 as a mask. The dimension (plane dimension of the vibratory section 21) of a via hole opening formed in the upper surface of the Si substrate 12 was 200×200 μm.

With respect to the thin film bulk acoustic resonator (FBAR) obtained in the above-described steps, the composition of the AlN piezoelectric film 16 was analyzed by XPS spectroscopy. Moreover, a multifunctional X-ray diffraction apparatus for surface structure evaluation was used to carry out thin film X-ray diffraction measurement by the diffractometer method (lattice constant measurement by θ–2θ rotation and full-width half maximum (FWHM) measurement of Kα1 diffraction peak) and full-width half maximum (FWHM) measurement of the rocking curve of (0002) diffraction peak. An oxygen content of the AlN piezoelectric film 16 measured by the XPS spectroscopy was less than 0.5 Atm %. Evaluation results of the composition and crystallinity of the AlN piezoelectric film 16 are shown in Table 1.

Moreover, a microwave prober produced by Cascade Microtech Incorporated and network analyzer were used to measure impedance characteristics between the electrode terminals 15b, 17b of the thin film piezoelectric resonator. Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. A fundamental frequency of thickness vibration, electromechanical coupling coefficient $k_t^2$, temperature coefficient of frequency $\tau_f$, and acoustic quality factor Q of the obtained thin film bulk acoustic resonator are as shown in Table 2.

EXAMPLES 2 TO 4

In each of the present examples, the thin film bulk acoustic resonator having the structure shown in FIGS. 1, 2 was prepared as follows.

That is, a silicon oxide ($SiO_2$) layer having a thickness in a range of 0.2 to 0.7 μm was formed on the upper and lower surfaces of the Si substrate 12 having a thickness of 300 μm by a thermal oxidation method. The $SiO_2$ layer on the upper surface was formed as the base film 13. Moreover, the $SiO_2$ layer on the lower surface was formed in the pattern of the mask for forming the via hole described later with respect to the substrate 12.

A stacked film of a 15 nm thick Ti layer and a 100 nm thick Pt layer on the Ti layer was formed on the surface of the base film 13 by the DC magnetron sputtering method, and patterned by the photolithography to form the lower electrode 15. The main portion 15a of the lower electrode 15 was formed in the shape close to the rectangular shape having a plane dimension of 140×160 μm. It was confirmed by the X-ray diffraction measurement that the lower electrode 15 was the single orientation film. That is, in the θ–2θ rotation diffractometer method, the diffraction peak strength of the plane other than the (111) series planes was not more than the detection limit, that is, 0.5% or less of the maximum peak strength of the (111) plane. The AlN thin film containing the third component whose composition is shown in Table 1 was formed on this Pt/Ti lower electrode 15. The thickness of the AlN thin film was as shown in Table 2. The AlN thin film was formed by the reactive RF magnetron sputtering method using a target of the Al alloy including an appropriate composition or a target of the metal Al partially including the buried rare earth metal bulk. The AlN thin film was patterned in the predetermined shape to form the piezoelectric film 16 by the wet etching using hot phosphoric acid. Thereafter, the DC magnetron sputtering method and lift-off method were used to form the Al upper electrode 17 having a thickness of 100 nm. The main portion 17a of the upper electrode 17 was formed in the shape close to the rectangular shape having a plane dimension of 140×160 μm, and was disposed in the position corresponding to the lower electrode main portion 15a.

Next, the side of the structure obtained as described above, on which the upper and lower electrodes 15, 17 and piezoelectric film 16 were formed, was coated with the PMMA resin, and the via hole 20 constituting the gap was formed by etching and removing the portion of the Si substrate 12 corresponding to the vibratory section 21 with the KOH aqueous solution, using the patterned $SiO_2$ layer formed on the lower surface of the Si substrate 12 as the mask. The dimension (plane dimension of the vibratory section 21) of the via hole opening formed in the upper surface of the Si substrate 12 was 200×200 μm.

With respect to the thin film bulk acoustic resonator (FBAR) obtained in the above-described steps, the composition of the AlN piezoelectric film 16 was analyzed by the XPS spectroscopy. Moreover, the multifunctional X-ray diffraction apparatus for the surface structure evaluation was used to carry out the thin film X-ray diffraction measurement by the diffractometer method (lattice constant measurement by θ–2θ rotation and full-width half maximum (FWHM) measurement of Kα1 diffraction peak) and full-width half maximum (FWHM) measurement of the rocking curve of (0002) diffraction peak. The oxygen content of the AlN piezoelectric film 16 measured by the XPS spectroscopy was less than 0.5 Atm %. The evaluation results of the composition and crystallinity of the AlN piezoelectric film 16 are shown in Table 1.

Moreover, the microwave prober produced by Cascade Microtech Incorporated and network analyzer were used to measure impedance characteristics between the electrode terminals 15b, 17b of the thin film piezoelectric resonator. Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and the acoustic quality factor Q of the obtained thin film bulk acoustic resonator were as shown in Table 2.

EXAMPLES 5

In the present example, the thin film bulk acoustic resonator having the structure shown in FIGS. 3, 4 was prepared as follows.

Steps similar to those of Example 1 were carried out except the shapes and dimensions of the upper and lower electrodes 15, 17. The lower electrode 15 was formed in the rectangular shape having a plane dimension of 120×280 μm so as to extend while including the region corresponding to the vibratory section 21. For the upper electrode 17, the main portions 17Aa, 17Ba each having the shape close to the rectangular shape having the plane dimension of 65×85 μm were arranged at an interval of 20 μm.

With respect to the thin film bulk acoustic resonator (FBAR) obtained in the above-described steps, the composition of the AlN piezoelectric film 16 was analyzed by the XPS spectroscopy. Moreover, the multifunctional X-ray diffraction apparatus for the surface structure evaluation was used to carry out the thin film X-ray diffraction measurement by the diffractometer method (lattice constant measurement by θ–2θ rotation and full-width half maximum (FWHM) measurement of Kα1 diffraction peak) and full-width half maximum (FWHM) measurement of the rocking curve of the (0002) diffraction peak. The oxygen content of the AlN piezoelectric film 16 measured by the XPS spectroscopy was less than 0.5 Atm %. The evaluation results of the composition and crystallinity of the AlN piezoelectric film 16 are shown in Table 1.

Moreover, the network analyzer and the microwave prober produced by Cascade Microtech Incorporated were used to analyze the amplitude and spectrum of the signal. In the measurement of the signal, the terminal portion (exposed portion on the left side in FIGS. 3, 4) of the lower electrode 15 of the thin film piezoelectric resonator was connected to a ground electrode, a signal was inputted via the terminal portion 17Ab of the upper electrode 17A and the output signal was extracted from the terminal portion 17Bb of the upper electrode 17B. The electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator are as shown in Table 2.

EXAMPLES 6 TO 8

In each of the present examples, the thin film bulk acoustic resonator having the structure shown in FIGS. 3, 4 was prepared as follows.

The steps similar to those of Examples 2 to 4 were carried out except the shapes and dimensions of the upper and lower electrodes 15, 17. The lower electrode 15 was formed in the rectangular shape having a plane dimension of 150×300 μm so as to extend while including the region corresponding to the vibratory section 21. For the upper electrode 17, the main portions 17Aa, 17Ba each having the shape close to the rectangular shape having the plane dimension of 70×90 μm were arranged at an interval of 20 μm.

With respect to the thin film bulk acoustic resonator (FBAR) obtained in the above-described steps, the composition of the AlN piezoelectric film 16 was analyzed by the XPS spectroscopy. Moreover, the multifunctional X-ray diffraction apparatus for the surface structure evaluation was used to carry out the thin film X-ray diffraction measurement by the diffractometer method (lattice constant measurement by θ–2θ rotation and full-width half maximum (FWHM) measurement of Kα1 diffraction peak) and full-width half maximum (FWHM) measurement of the rocking curve of the (0002) diffraction peak. The oxygen content of the AlN piezoelectric film 16 measured by the XPS spectroscopy was less than 0.5 Atm %. The evaluation results of the composition and crystallinity of the AlN piezoelectric film 16 are shown in Table 1.

Moreover, the network analyzer and the microwave prober produced by Cascade Microtech Incorporated were used to analyze the amplitude and spectrum of the signal. In the measurement of the signal, the terminal portion (exposed portion on the left side in FIGS. 3, 4) of the lower electrode 15 of the thin film piezoelectric resonator was connected to the ground electrode, the signal was inputted via the terminal portion 17Ab of the upper electrode 17A, the output signal was extracted from the terminal portion 17Bb of the upper electrode 17B. The electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator were as shown in Table 2.

COMPARATIVE EXAMPLES 1, 2

The steps similar to those of Examples 1, 5 were carried out except that the alkaline earth metal or the rare earth metal was not added as the third component during the formation of the AlN thin film, and the thin film bulk acoustic resonator having the structure shown in FIGS. 1, 2 and that having the structure shown in FIGS. 3, 4 were prepared.

With respect to the thin film bulk acoustic resonator (FBAR) obtained in the above-described steps, the composition of the AlN piezoelectric film was analyzed by the XPS spectroscopy. Moreover, the multifunctional X-ray diffraction apparatus for the surface structure evaluation was used to carry out the thin film X-ray diffraction measurement by the diffractometer method (lattice constant measurement by θ–2θ rotation and full-width half maximum (FWHM) measurement of Kα1 diffraction peak) and the full-width half maximum (FWHM) measurement of the rocking curve of (0002) diffraction peak. The oxygen content of the AlN thin film measured by the XPS spectroscopy was about 2.5 Atm % both in Comparative Examples 1, 2. Analysis/evaluation was carried out by an operation similar to that of Examples 1 to 8. However, since the quality of the AlN thin film was poor, there was a possibility of increase of the oxygen content of the film based on the oxidation caused before the XPS analysis. The evaluation results of the composition and crystallinity of the AlN thin film are shown in Table 1.

Moreover, the microwave prober produced by Cascade Microtech Incorporated and network analyzer were used to measure the impedance characteristics in the same manner as in Examples 1, 5. Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator were as shown in Table 2.

It is to be noted that Table 1 shows measured results of the C-axis lattice constants of the (0001) orientation AlN crystals having the compositions in the respective examples. In the thin film, a lattice constant different from that of the AlN bulk crystal is indicated because of a difference in a thermal expansion coefficient from the Si substrate in a cooling process, a remaining stress by the mismatch of the lattice from the lower electrode, and presence of a lattice defect inside the AlN crystal, and the like.

From the above-described results, it has been shown that the FBAR using the aluminum nitride thin film containing the alkaline earth metal or the rare-earth metal indicates the superior characteristics which have not heretofore been achieved. This is considered to be based on the fact that by the addition of the alkaline earth metal or the rare earth metal, concentration of oxygen dissolved in the crystal lattice of aluminum nitride which forms the piezoelectric film can be reduced, and the orientation, crystallinity, and grain boundary strength are improved. When the aluminum nitride thin film containing the alkaline earth metal or the rare earth metal is applied to the resonator, filter, and the like, the performances such as the acoustic quality factor (Q value) and frequency-temperature characteristic are improved.

EXAMPLE 9

In the present example, the thin film bulk acoustic resonator having the structure shown in FIGS. 1, 2 was prepared as follows.

That is, the SiO$_2$ layer having a thickness of 1.1 μm was formed on the upper and lower surfaces of the (100) Si substrate 12 having a thickness of 350 μm by the thermal oxidation method. Thereafter, only the SiO₂ layer on the upper surface was etched to adjust the thickness of the SiO₂ layer on the upper surface to 0.28 μm, thereby forming the insulating layer 13 made of SiO₂. The Pt electrode layer (including Ti adhesive layer) having a thickness of 110 nm was formed on the upper surface of the insulating layer 13 by the DC magnetron sputtering method, and patterned by photolithography to form the Pt/Ti lower electrode 15. The main portion 15a of the lower electrode 15 was formed in the shape close to the rectangular shape having a plane dimension of 140×160 μM. It was confirmed by the X-ray diffraction measurement that the lower electrode 15 was the (111) orientation film, that is, the single orientation film. On this Pt/Ti lower electrode 15, an $Al_{1-y}In_yN$-based solid solution thin film (piezoelectric film) having the composition of Table 1 was formed by the reactive RF magnetron sputtering method using a target of the Al—In alloy having an appropriate composition and under the conditions described in Table 1. The $Al_{1-y}In_yN$-based solid solution thin film was patterned in the predetermined shape to form the piezoelectric film 16 by the wet etching using hot phosphoric acid. Thereafter, the DC magnetron sputtering method and lift-off method were used to form the Pt/Ti upper electrode 17 having a thickness of 110 nm and having the main portion 17a of the shape close to the rectangular shape having the plane dimension of 140×160 μm. The main portion 17a of the upper electrode 17 was formed in the position corresponding to the lower electrode main portion 15a. Next, the side of the stacked structure obtained as described above, on which the lower electrode 15, upper electrode 17, and piezoelectric film 16 were formed, was coated with a protect wax, and the 1.1 μm thick SiO₂ layer formed on the lower surface of the Si substrate 12 was patterned to form a mask. The formed mask was used to etch/remove the portion of the Si substrate 12 corresponding to the vibratory section 21 with the KOH aqueous solution, and the via hole 20 constituting the gap was formed.

With respect to the thin film bulk acoustic resonator (FBAR) obtained in the above-described steps, the composition of the $Al_{1-y}In_yN$-based solid solution thin film was analyzed by the XPS spectroscopy. Moreover, the multifunctional X-ray diffraction apparatus for the surface structure evaluation was used to carry out the lattice constant measurement by the diffractometer method and the full-width half maximum (FWHM) measurement of the rocking curve of the (0002) diffraction peak. The evaluation results of the composition and crystallinity of the $Al_{1-y}In_yN$-based solid solution thin film are shown in Table 3.

Moreover, the microwave prober produced by Cascade Microtech Incorporated and network analyzer were used to measure the impedance characteristics between the electrode terminals 15b, 17b of the thin film piezoelectric resonator. Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 10

In the present example, the thin film bulk acoustic resonator having the structure shown in FIGS. 1, 2 was prepared as follows.

That is, the SiO₂ layer having a thickness of 1.1 μm was formed on the upper and lower surfaces of the (100) Si substrate 12 having a thickness of 350 μm by the thermal oxidation method. Thereafter, only the SiO₂ layer on the upper surface was etched to adjust the thickness of the SiO₂ layer on the upper surface to the value described in Table 4, thereby forming the insulating layer 13 made of SiO₂. The Pt electrode layer (including the Ti adhesive layer) having a thickness described in Table 3 was formed on the upper surface of the insulating layer 13 by the DC magnetron sputtering method, and patterned by the photolithography to form the Pt/Ti lower electrode 15. The main portion 15a of the lower electrode 15 was formed in the shape close to the rectangular shape having a plane dimension of 140×160 μm. It was confirmed by the X-ray diffraction measurement that the lower electrode 15 was the (111) orientation film, that is, the single orientation film. On this Pt/Ti lower electrode 15, an $Al_{1-x}Ga_xN$-based solid solution thin film (piezoelectric film) having the composition shown in Table 3 was formed by the reactive RF magnetron sputtering method using a target of the Al—Ga alloy having the appropriate composition and under the conditions described in Table 3. The $Al_{1-x}Ga_xN$-based solid solution thin film was patterned in the predetermined shape to form the piezoelectric film 16 by the wet etching using hot phosphoric acid. Thereafter, the DC magnetron sputtering method and lift-off method were used to form the Pt/Ti upper electrode 17 having a thickness shown in Table 3 and having the main portion 17a of the shape close to the rectangular shape having the plane dimension of 140×160 μm. The main portion 17a of the upper electrode 17 was formed in the position corresponding to the lower electrode main portion 15a. Next, the side of the stacked structure obtained as described above, on which the lower electrode 15, upper electrode 17, and piezoelectric film 16 were formed, was coated with the protect wax, and the 1.1 μm thick SiO₂ layer formed on the lower surface of the Si substrate 12 was patterned to form the mask. The via hole 20 constituting the gap was fabricated using the formed mask to etch/remove the portion of the Si substrate 12 corresponding to the vibratory section 21 with the KOH aqueous solution.

With respect to the thin film bulk acoustic resonator (FBAR) obtained in the above-described steps, the composition of the $Al_{1-x}Ga_xN$-based solid solution thin film (piezoelectric film) was analyzed by the XPS spectroscopy. Moreover, the multifunctional X-ray diffraction apparatus for the surface structure evaluation was used to carry out the lattice constant measurement by the diffractometer method and full-width half maximum (FWHM) measurement of the rocking curve of the (0002) diffraction peak. The evaluation results of the composition and crystallinity of the $Al_{1-x}Ga_xN$-based solid solution thin film are shown in Table 3.

Moreover, the microwave prober produced by Cascade Microtech Incorporated and network analyzer were used to measure the impedance characteristics between the electrode terminals 15b, 17b of the thin film piezoelectric resonator. Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 11

In the present example, the thin film bulk acoustic resonator having the structure shown in FIGS. 3, 4 was prepared as follows.

That is, the lower electrode 15 was formed in the rectangular shape having a plane dimension of 120×280 µm so as to extend while including the region corresponding to the vibratory section 21. For the upper electrode 17, the main portions 17Aa, 17Ba each having the shape close to the rectangular shape having the plane dimension of 65×85 µm were arranged at an interval of 20 µm. Furthermore, the steps similar to Example 10 were carried out except that the thickness, materials, and compositions of the insulating layer 13, lower electrode 15, upper electrode 17, and piezoelectric film 16 were set as shown in Tables 3 and 4.

In the same manner as in Example 10, the composition analysis and X-ray diffraction measurement of the obtained solid solution thin film (piezoelectric film) were carried out. The evaluation results of the composition and crystallinity of the solid solution thin film are shown in Table 3.

Moreover, the network analyzer and the microwave prober produced by Cascade Microtech Incorporated was used to analyze the amplitude and spectrum of the signal. In the measurement of the signal, the terminal portion (exposed portion on the left side in FIGS. 3, 4) of the lower electrode 15 of the thin film piezoelectric resonator was connected to the ground electrode, the signal was inputted via the terminal portion 17Ab of the upper electrode 17A, the output signal was extracted from the terminal portion 17Bb of the upper electrode 17B. The electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 12

In the present example, the thin film bulk acoustic resonator having the structure shown in FIGS. 1, 2 was prepared as follows.

That is, the steps similar to those of Example 10 were carried out except that the thickness, materials, and compositions of the insulating layer 13, lower electrode 15, upper electrode 17, and piezoelectric film 16 were set as shown in Tables 3 and 4. Here, the $SiN_x$ layer for the insulating layer 13 was formed by the low-pressure CVD method.

In the same manner as in Example 10, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$ temperature coefficient of frequency $\tau_f$, and acoustic quality factor Q were obtained from the measured values of the resonant frequency $f_r$ and antiresonant frequency $f_a$ obtained in the same manner as in Example 10. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 13

In the present example, the thin film bulk acoustic resonator having the structure shown in FIGS. 1, 2 was prepared as follows.

That is, the steps similar to those of Example 12 were carried out except that the thickness, materials, and compositions of the insulating layer 13, lower electrode 15, upper electrode 17, and piezoelectric film 16 were set as shown in Tables 3 and 4.

In the same manner as in Example 12, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 12. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 14

In the present example, the thin film bulk acoustic resonator having the structure shown in FIGS. 1, 2 was prepared as follows.

That is, the steps similar to those of Example 10 were carried out except that the thickness, materials, and compositions of the insulating layer 13, lower electrode 15, upper electrode 17, and piezoelectric film 16 were set as shown in Tables 3 and 4.

In the same manner as in Example 10, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 10. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 15

In the present example, the thin film bulk acoustic resonator having the structure shown in FIGS. 3, 4 was prepared as follows.

That is, the steps similar to those of Example 11 were carried out except that the thickness, materials, and compositions of the insulating layer 13, lower electrode 15, upper electrode 17, and piezoelectric film 16 were set as shown in Tables 3 and 4.

In the same manner as in Example 11, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 11. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 16

In the present example, the thin film bulk acoustic resonator having the structure shown in FIGS. 3, 4 was prepared as follows.

That is, the steps similar to those of Example 11 were carried out except that the thickness, materials, and compositions of the insulating layer 13, lower electrode 15, upper electrode 17, and piezoelectric film 16 were set as shown in Tables 3 and 4.

In the same manner as in Example 11, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 11. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 17

In the present example, the thin film bulk acoustic resonator having the structure shown in FIGS. 1, 2 was prepared as follows.

That is, the steps similar to those of Example 12 were carried out except that the thickness, materials, and compositions of the insulating layer 13, lower electrode 15, upper electrode 17, and piezoelectric film 16 were set as shown in Tables 3 and 4.

In the same manner as in Example 12, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 12. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

EXAMPLE 18

In the present example, the thin film bulk acoustic resonator having the structure shown in FIGS. 3, 4 was prepared as follows.

That is, the steps similar to those of Example 16 were carried out except that the thickness, materials, and compositions of the insulating layer 13, lower electrode 15, upper electrode 17, and piezoelectric film 16 were set as shown in Tables 3 and 4.

In the same manner as in Example 16, the composition analysis and X-ray diffraction measurement of the obtained solid solution thin film (piezoelectric film) were carried out. The evaluation results of the composition and crystallinity of the solid solution thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 16. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

COMPARATIVE EXAMPLES 3, 4

In the present comparative examples, the thin film bulk acoustic resonator having the structure shown in FIGS. 1, 2 or FIGS. 3, 4 was prepared as follows.

That is, the steps similar to those of Example 9 or 16 were carried out except that instead of the $Al_{1-x}Ga_xN$-based solid solution thin film or the $Al_{1-y}In_yN$-based solid solution thin film, the AlN thin film was formed by the reactive RF magnetron sputtering method and that the shapes, thickness, and materials of the insulating layer 13, lower electrode 15, upper electrode 17, and piezoelectric thin film 16 were set as shown in Tables 3 and 4.

With respect to the thin film bulk acoustic resonator (FBAR) obtained in the above-described steps, the composition of the AlN thin film was analyzed by the XPS spectroscopy. Moreover, the multifunctional X-ray diffraction apparatus for the surface structure evaluation was used to carry out the lattice constant measurement by the diffractometer method and full-width half maximum (FWHM) measurement of the rocking curve of the (0002) diffraction peak. The oxygen content of the AlN thin film measured by the XPS spectroscopy was as shown in Table 3. The analysis/evaluation was carried out by the operation similar to that of Example 9 or 16. However, since the quality of the AlN thin film was poor, there was a possibility of increase of the oxygen content of the film based on the oxidation caused before the XPS analysis. The evaluation results of the crystallinity of the AlN thin film are shown in Table 3.

Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$ obtained in the same manner as in Example 9 or 16. The fundamental frequency of thickness vibration, electromechanical coupling coefficient $k_t^2$, temperature coefficient of frequency $\tau_f$, and acoustic quality factor Q of the obtained thin film bulk acoustic resonator are shown in Table 4.

From the above-described results, it has been shown that the FBAR or SBAR using the thin film composed of the solid solution of aluminum nitride and gallium nitride or that composed of the solid solution of aluminum nitride and indium nitride as the piezoelectric film indicates the superior characteristics which have not heretofore been achieved. This is considered to be based on the fact that the lattice matching property with respect to the metal crystal for use in the electrode becomes better with the use of the above-described piezoelectric film. As a result, the orientation and crystallinity of the piezoelectric film are improved. When the piezoelectric film is applied to the resonator, filter, and the like, the performances such as the acoustic quality factor (Q value) and frequency-temperature characteristic can be improved.

EXAMPLE 19

In the present example, the thin film piezoelectric resonator having the structure shown in FIGS. 7, 8 was prepared as follows.

That is, the $SiO_2$ layer having a thickness of 1.1 μm was formed on the upper and lower surfaces of the (100) Si substrate 12 having a thickness of 350 μm by the thermal oxidation method. Thereafter, only the SiO$_2$ layer on the upper surface was etched to adjust the thickness of the SiO$_2$ layer on the upper surface, thereby forming the insulating layer 13 made of SiO$_2$ and having the thickness shown in Table 7. The Au metal layer (second metal layer) having a thickness of 60 nm, and the Mo metal layer (first metal layer) having a thickness of 150 nm were formed in this order on the upper surface of the insulating layer 13 by the DC magnetron sputtering method, and patterned by the photolithography to form the Mo/Au lower electrode 15. The main portion 15a of the lower electrode 15 was formed in the shape close to the rectangular shape having a plane dimension of 150×170 μm. It was confirmed by the X-ray diffraction measurement that the Au metal layer was the (111) orientation film, that is, the single orientation film and that the Mo metal layer was the (110) orientation film, that is, the single orientation film. On the substrate 12 on which the Mo/Au lower electrode 15 was formed, the AlN thin film was formed under the conditions described in Table 6 by the reactive RF magnetron sputtering method using the target of metal Al having a purity of 5N. The AlN thin film was patterned in the predetermined shape to form the AlN piezoelectric thin film 16 by the wet etching using hot phosphoric acid.

Thereafter, the DC magnetron sputtering method and lift-off method were used to form the Al upper electrode 17 having a thickness of 190 nm and having the main portion 17a of the shape close to the rectangular shape having the plane dimension of 130×150 μm. The main portion 17a of the upper electrode 17 was formed in the position corresponding to the lower electrode main portion 15a. Next, the side of the stacked structure obtained as described above, on which the lower electrode 15, upper electrode 17, and piezoelectric thin film 16 were formed, was coated with the protect wax, and the 1.1 μm thick SiO$_2$ layer formed on the lower surface of the Si substrate 12 was patterned to form the mask. The via hole 20 constituting the gap was formed by using the formed mask to etch/remove the portion of the Si substrate 12 corresponding to the vibratory section 21 with the KOH aqueous solution.

With respect to the AlN thin film-metal electrode stacked structure manufactured in the above-described steps, the composition of the obtained AlN thin film (piezoelectric thin film) was analyzed by the XPS spectroscopy. Moreover, the multifunctional X-ray diffraction apparatus for the surface structure evaluation was used to carry out the lattice constant measurement by the diffractometer method and the full-width half maximum (FWHM) measurement of the rocking curve of the (0002) diffraction peak. The evaluation results of the composition and crystallinity of the AlN thin film are shown in Table 6.

Moreover, the microwave prober produced by Cascade Microtech Incorporated and network analyzer were used to measure the impedance characteristics between the electrode terminals 15b, 17b of the thin film bulk acoustic resonator (FBAR). Moreover, the electromechanical coupling coefficient $k_t^2$, temperature coefficient of frequency $\tau_f$, and acoustic quality factor Q were obtained from the measured values of the resonant frequency $f_r$ and antiresonant frequency $f_a$. The fundamental frequency of thickness vibration, electromechanical coupling coefficient $k_t^2$, and acoustic quality factor Q of the obtained thin film bulk acoustic resonator are shown in Table 7.

EXAMPLE 20

In the present example, the thin film piezoelectric resonator having the structure shown in FIGS. 7 and 8 was prepared as follows.

That is, the insulating layer 13 composed of SiO$_2$ was formed by the operation similar to that of Example 19. On the upper surface of the insulating layer 13, the Ti metal layer (adhesive metal layer), Pt metal layer (second metal layer), and Mo metal layer (first metal layer) having the thickness shown in Table 5 were formed in this order by the DC magnetron sputtering method, and patterned by the photolithography to form the Mo/Pt/Ti lower electrode 15. The main portion 15a of the lower electrode 15 was formed in the shape close to the rectangular shape having a plane dimension of 150×170 μm. It was confirmed by the X-ray diffraction measurement that the Pt metal layer was the (111) single orientation film and that the Mo metal layer was the (110) single orientation film. On the substrate 12 on which the Mo/Pt/Ti lower electrode 15 was formed, the piezoelectric thin film 16 was formed by the operation similar to that of Example 19. Thereafter, the DC magnetron sputtering method and lift-off method were used to form the Mo/Pt/Ti upper electrode 17 having the main portion 17a of the shape close to the rectangular shape having the plane dimension of 130×150 μm. The Ti metal layer was used as the adhesive metal layer, the Pt metal layer was used as a fourth metal layer with face-centered cubic structure, the Mo metal layer was used as a third metal layer with body-centered cubic structure, and these thickness were set as shown in Table 5. The main portion 17a of the upper electrode 17 was disposed in the position corresponding to the lower electrode main portion 15a. Next, the via hole 20 constituting the gap was formed by the operation similar to that of Example 19.

With respect to the AlN thin film-metal electrode stacked structure manufactured in the above-described steps, the composition of the obtained AlN thin film (piezoelectric thin film) was analyzed by the XPS spectroscopy. Moreover, the multifunctional X-ray diffraction apparatus for the surface structure evaluation was used to carry out the lattice constant measurement by the diffractometer method and the full-width half maximum (FWHM) measurement of the rocking curve of the (0002) diffraction peak. The evaluation results of the composition and crystallinity of the AlN thin film are shown in Table 6.

Moreover, the microwave prober produced by Cascade Microtech Incorporated and network analyzer were used to measure the impedance characteristics between the electrode terminals 15b, 17b of the above-described thin film bulk acoustic resonator (FBAR). Moreover, the electromechanical coupling coefficient $k_t^2$ and acoustic quality factor Q were obtained from the measured values of the resonant frequency $f_r$ and antiresonant frequency $f_a$. The fundamental frequency of thickness vibration, electromechanical coupling coefficient $k_t^2$, and acoustic quality factor Q of the obtained thin film bulk acoustic resonator are shown in Table 7.

EXAMPLE 21

In the present example, the thin film piezoelectric resonator having the structure shown in FIGS. 7 and 8 was prepared as follows.

That is, the insulating layer 13 composed of SiO$_2$ was formed by the operation similar to that of Example 19. On the upper surface of the insulating layer 13, the Ti metal layer (adhesive metal layer), Au metal layer (second metal layer), and Mo metal layer (first metal layer) having the thickness shown in Table 5 were formed in this order by the DC magnetron sputtering method, and patterned by the photolithography to form the Mo/Au/Ti lower electrode 15. The main portion 15a of the lower electrode 15 was formed in the shape close to the rectangular shape having the plane dimension of 150×170 µm. It was confirmed by the X-ray diffraction measurement that the Au metal layer was the (111) single orientation film and that the Mo metal layer was the (110) single orientation film. On the substrate 12 on which this Mo/Au/Ti lower electrode 15 was formed, the piezoelectric thin film 16 was formed by the operation similar to that of Example 19. Thereafter, the DC magnetron sputtering method and lift-off method were used to form the Mo upper electrode 17 having a thickness of 195 nm and having the main portion 17a of the shape close to the rectangular shape having the plane dimension of 130×150 µm. The main portion 17a of the upper electrode 17 was disposed in the position corresponding to the lower electrode main portion 15a. Next, the via hole 20 constituting the gap was formed by the operation similar to that of Example 19. Furthermore, the insulating layer 13 of the region corresponding to the vibratory section 21 was etched/removed by the dry etching to expose the lower surface of the lower electrode 15.

With respect to the AlN thin film-metal electrode stacked structure manufactured in the above-described steps, in the same manner as in Example 19, the composition of the AlN thin film (piezoelectric thin film) was analyzed, the lattice constant was measured by the diffractometer method, and full-width half maximum (FWHM) of the rocking curve of (0002) diffraction peak was measured. The evaluation results of the composition and crystallinity of the AlN thin film are shown in Table 6.

Moreover, in the same manner as in Example 19, the impedance characteristics between the electrode terminals 15b, 17b of the above-described thin film bulk acoustic resonator (FBAR) were measured. Moreover, the electromechanical coupling coefficient $k_t^2$ and acoustic quality factor Q were obtained from the measured values of the resonant frequency $f_r$ and antiresonant frequency $f_a$. The fundamental frequency of thickness vibration, electromechanical coupling coefficient $k_t^2$, and acoustic quality factor Q of the obtained thin film piezoelectric resonator are shown in Table 7.

EXAMPLES 22, 23

In each of the present examples, the thin film piezoelectric resonator having the structure shown in FIGS. 7 and 8 was prepared as follows.

That is, the $SiN_x$ layer having the thickness shown in Table 7 was formed on both the upper and lower surfaces of the (100) Si substrate 12 having a thickness of 300 µm by the low-pressure CVD method, and thus the insulating layer 13 made of $SiN_x$ was formed. On the upper surface of the insulating layer 13, the Ti metal layer (adhesive metal layer), Au metal layer (second metal layer), and Mo metal layer (first metal layer) having the thickness shown in Table 5 were formed in this order by the DC magnetron sputtering method, and patterned by the photolithography to form the Mo/Au/Ti lower electrode 15. The main portion 15a of the lower electrode 15 was formed in the shape close to the rectangular shape having the plane dimension of 150×170 µm. It was confirmed by the X-ray diffraction measurement that the Au metal layer was the (111) single orientation film and that the Mo metal layer was the (110) single orientation film. After forming the $SiN_x$ layer (interface layer) or the Al layer (interface layer) having the thickness shown in Table 5 on the substrate 12 on which the Mo/Au/Ti lower electrode 15 was formed, the piezoelectric thin film 16 was formed by the operation similar to that of Example 19. Accordingly, the $SiN_x$ layer or the Al layer was disposed in the interface between the lower electrode 15 and the AlN thin film (piezoelectric thin film) 16.

Thereafter, the DC magnetron sputtering method and lift-off method were used to form the Mo/Au/Ni upper electrode 17 [Example 22] or 195 nm thick Mo upper electrode 17 [Example 23] having the main portion 17a of the shape close to the rectangular shape having the plane dimension of 130×150 µm. In Example 22, the Ti metal layer was used as the adhesive metal layer, the Pt metal layer was used as the fourth metal layer, the Mo metal layer was used as the third metal layer, and their thickness were set as shown in Table 5. The main portion 17a of the upper electrode 17 was disposed in the position corresponding to the lower electrode main portion 15a. Next, the via hole 20 constituting the gap was formed by the operation similar to that of Example 19.

With respect to the AlN thin film-metal electrode stacked structure manufactured in the above-described steps, in the same manner as in Example 19, the composition of the AlN thin film (piezoelectric thin film) was analyzed, the lattice constant was measured by the diffractometer method, and full-width half maximum (FWHM) of the rocking curve of (0002) diffraction peak was measured. The evaluation results of the composition and crystallinity of the AlN thin film are shown in Table 6.

Moreover, in the same manner as in Example 19, the impedance characteristics between the electrode terminals 15b, 17b of the above-described thin film bulk acoustic resonator (FBAR) were measured. Moreover, the electromechanical coupling coefficient $k_t^2$ and acoustic quality factor Q were obtained from the measured values of the resonant frequency $f_r$ and antiresonant frequency $f_a$. The fundamental frequency of thickness vibration, electromechanical coupling coefficient $k_t^2$, and acoustic quality factor Q of the obtained thin film piezoelectric resonator are shown in Table 7.

EXAMPLES 24, 25

In each of the present examples, the thin film piezoelectric resonator having the structure shown in FIGS. 3 and 4 was prepared as follows.

That is, by the operation similar to Example 22, the insulating layer 13 composed of $SiN_x$ was formed. On the upper surface of the insulating layer 13, the adhesive metal layer, second metal layer, and first metal layer having the materials and thickness shown in Table 5 were formed in this order by the DC magnetron sputtering method, and patterned by the photolithography to form the Mo (TZM alloy)/Au/V lower electrode 15 [Example 24] or the lower electrode 15 [Example 25] composed of Mo—Re alloy/Au/Cr. The main portion 15a of the lower electrode 15 was formed in the shape close to the rectangular shape having the plane dimension of 120×280 µm and extending so as to include the portion corresponding to the vibratory section 21. It was confirmed by the X-ray diffraction measurement that the Au metal layer was the (111) single orientation film and that the Mo (TZM alloy) metal layer or the Mo—Re alloy metal layer was the (110) single orientation film. On the substrate 12 on which the Mo(TZM alloy)/Au/V lower electrode 15 or Mo—Re alloy/Au/Cr lower electrode 15 was formed, the piezoelectric thin film 16 was formed by the operation similar to that of Example 19.

Thereafter, the DC magnetron sputtering method and lift-off method were used to form the Mo (TZM alloy)/Au upper electrode 17 [Example 24] or Mo—Re alloy/Au/Ti upper electrode 17 [Example 25] in which the main portions 17Aa, 17Ba each having the shape close to the rectangular shape having a plane dimension of 65×85 μm were arranged at an interval of 20 μm. In Example 24, the Au metal layer was used as the fourth metal layer, the Mo (TZM alloy) metal layer was used as the third metal layer, and their thickness were set as shown in Table 5. Moreover, in Example 25, the Ti metal layer was used as the adhesive metal layer, the Au metal layer was used as the fourth metal layer, the Mo—Re alloy metal layer was used as the third metal layer, and their thickness were set as shown in Table 5. The main portions 17Aa, 17Ba of the upper electrode 17 were arranged in the positions corresponding to the lower electrode 15. Next, the via hole 20 constituting the gap was formed by the operation similar to that of Example 19.

With respect to the AlN thin film-metal electrode stacked structure manufactured in the above-described steps, in the same manner as in Example 19, the composition of the AlN thin film (piezoelectric thin film) was analyzed, the lattice constant was measured by the diffractometer method, and full-width half maximum (FWHM) of the rocking curve of (0002) diffraction peak was measured. The evaluation results of the composition and crystallinity of the AlN thin film are shown in Table 6.

Moreover, the network analyzer and the microwave prober produced by Cascade Microtech Incorporated was used to analyze the signal amplitude and spectrum, and the like. In the measurement of the signal, the terminal portion (exposed portion on the left side in FIGS. 3, 4) of the lower electrode 15 of the thin film piezoelectric resonator was connected to the ground electrode, the signal was inputted via the terminal portion 17Ab of the upper electrode 17A, the output signal was extracted from the terminal portion 17Bb of the upper electrode 17B. The electromechanical coupling coefficient $k_t^2$ and acoustic quality factor Q were obtained from the measured values of the resonant frequency $f_r$ and antiresonant frequency $f_a$ of each resonator. The fundamental frequency of thickness vibration, electromechanical coupling coefficient $k_t^2$, and acoustic quality factor Q of the obtained thin film bulk acoustic resonator are shown in Table 7.

EXAMPLE 26

In the present example, the thin film piezoelectric resonator having the structure shown in FIGS. 3, 4 was prepared as follows.

That is, the steps similar to those of Example 24 were carried out except that the materials and thickness of the insulating layer 13, lower electrode 15, upper electrode 17, and piezoelectric thin film 16 were set as shown in Tables 5 to 7. Here, as the insulating layer 13, the $SiO_2$ layer formed by the thermal oxidation method was used.

In the same manner as in Example 24, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 24. The fundamental frequency of thickness vibration, electromechanical coupling coefficient $k_t^2$, and acoustic quality factor Q of the obtained thin film bulk acoustic resonator are shown in Table 7.

EXAMPLES 27, 28

In each of the present examples, the thin film piezoelectric resonator having the structure shown in FIGS. 7 and 8 was prepared as follows.

That is, the steps similar to those of Example 20 were carried out except that the materials and thickness of the insulating layer 13, lower electrode 15, upper electrode 17, and piezoelectric thin film 16 were set as shown in Tables 5 to 7.

In the same manner as in Example 20, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 20. The fundamental frequency of thickness vibration, electromechanical coupling coefficient $k_t^2$, and acoustic quality factor Q of the obtained thin film bulk acoustic resonator are shown in Table 7.

EXAMPLES 29, 30

In each of the present examples, the thin film piezoelectric resonator having the structure shown in FIGS. 7, 8 was prepared as follows.

That is, the steps similar to those of Example 22 were carried out except that the materials and thickness of the insulating layer 13, lower electrode 15, upper electrode 17, and piezoelectric thin film 16 were set as shown in Tables 5 to 7.

In the same manner as in Example 22, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 22. The fundamental frequency of thickness vibration, electromechanical coupling coefficient $k_t^2$, and acoustic quality factor Q of the obtained thin film bulk acoustic resonator are shown in Table 7.

EXAMPLE 31

In the present example, the thin film piezoelectric resonator having the structure shown in FIGS. 3, 4 was prepared as follows.

That is, the steps similar to those of Example 26 were carried out except that the materials and thickness of the insulating layer 13, lower electrode 15, upper electrode 17, and piezoelectric thin film 16 were set as shown in Tables 5 to 7 and that after forming the via hole 20 constituting the gap, a portion of the insulating layer 13 in the region corresponding to the vibratory section 21 was also etched/removed by the dry etching to expose the lower surface of the lower electrode 15.

In the same manner as in Example 26, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 26. The fundamental frequency of thickness vibration, elec-

EXAMPLE 32

In the present example, the thin film piezoelectric resonator having the structure shown in FIGS. 3, 4 was prepared as follows.

That is, the steps similar to those of Example 26 were carried out except that the materials and thickness of the insulating layer 13, lower electrode 15, upper electrode 17, and piezoelectric thin film 16 were set as shown in Tables 5 to 7.

In the same manner as in Example 26, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 26. The fundamental frequency of thickness vibration, electromechanical coupling coefficient $k_t^2$, and acoustic quality factor Q of the obtained thin film bulk acoustic resonator are shown in Table 7.

COMPARATIVE EXAMPLES 5, 6

In each of the present comparative example, the thin film piezoelectric resonator having the structure shown in FIGS. 7 and 8 was prepared as follows.

That is, the steps similar to those of Example 19 were carried out except that the materials and thickness of the insulating layer 13, lower electrode 15, upper electrode 17, and piezoelectric thin film 16 were set as shown in Tables 5 to 7.

With respect to the AlN thin film-metal electrode stacked structure manufactured in the above-described steps, in the same manner as in Example 19, the composition of the AlN thin film (piezoelectric thin film) was analyzed, the lattice constant was measured by the diffractometer method, and full-width half maximum (FWHM) of the rocking curve of (0002) diffraction peak was measured. The evaluation results of the composition and crystallinity of the AlN thin film are shown in Table 6. The oxygen content of the AlN thin film measured by the XPS spectroscopy was as shown in Table 6. The analysis/evaluation was performed with the operation similar to that of Examples 19 to 32. However, since the quality of the AlN thin film was poor, there was a possibility of increase of the oxygen content of the film based on the oxidation caused before the XPS analysis.

Moreover, in the same manner as in Example 19, the impedance characteristics between the electrode terminals 15b, 17b of the above-described thin film bulk acoustic resonator (FBAR) were measured. Moreover, the electromechanical coupling coefficient $k_t^2$ and acoustic quality factor Q were obtained from the measured values of the resonant frequency $f_r$ and antiresonant frequency $f_a$. The fundamental frequency of thickness vibration, electromechanical coupling coefficient $k_t^2$, and acoustic quality factor Q of the obtained thin film piezoelectric resonator are shown in Table 7.

COMPARATIVE EXAMPLE 7

In the present comparative example, the thin film piezoelectric resonator having the structure shown in FIGS. 3 and 4 was prepared as follows.

That is, the steps similar to those of Example 26 were carried out except that the materials and thickness of the insulating layer 13, lower electrode 15, upper electrode 17, and piezoelectric thin film 16 were set as shown in Tables 5 to 7.

In the same manner as in Example 26, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 26. The fundamental frequency of thickness vibration, electromechanical coupling coefficient $k_t^2$, and acoustic quality factor Q of the obtained thin film piezoelectric resonator are shown in Table 7.

COMPARATIVE EXAMPLE 8

In the present comparative example, the thin film piezoelectric resonator having the structure shown in FIGS. 7 and 8 was prepared as follows.

That is, the steps similar to those of Example 19 were carried out except that the materials and thickness of the insulating layer 13, lower electrode 15, upper electrode 17, and piezoelectric thin film 16 were set as shown in Tables 5 to 7.

In the same manner as in Example 19, the composition analysis and X-ray diffraction measurement of the obtained AlN thin film (piezoelectric thin film) were carried out. The evaluation results of the composition and crystallinity of the AlN thin film are shown in Table 6.

Moreover, the electromechanical coupling coefficient $k_t^2$ and acoustic quality factor Q were obtained from the measured values of the resonant frequency $f_r$ and antiresonant frequency $f_a$ measured in the same manner as in Example 19. The fundamental frequency of thickness vibration, electromechanical coupling coefficient $k_t^2$, and acoustic quality factor Q of the obtained thin film piezoelectric resonator are shown in Table 7.

TABLE 1

| | Thin film forming condition | | | | X-ray diffraction measurement | | |
|---|---|---|---|---|---|---|---|
| | Nitrogen | Substrate | Third component | | Rocking | Lattice constant | Kα1 |
| | concentration (vol %) | temperature (° C.) | Type of element | Content (Atom %) | curve FWHM(deg) | C-axis length (nm) | peak FWHM(deg) |
| Example 1 | 20 | 380 | Ca | 1.5 | 3.2 | 0.4982 | 0.55 |
| Example 2 | 10 | 420 | Er | 1.1 | 2.2 | 0.4979 | 0.40 |
| Example 3 | 15 | 330 | Y | 1.0 | 1.8 | 0.4980 | 0.70 |
| Example 4 | 25 | 450 | Y | 0.8 | 1.5 | 0.4984 | 0.45 |

TABLE 1-continued

| | Thin film forming condition | | | | X-ray diffraction measurement | | |
|---|---|---|---|---|---|---|---|
| | Nitrogen concentration (vol %) | Substrate temperature (° C.) | Third component | | Rocking curve FWHM(deg) | Lattice constant C-axis length (nm) | Kα1 peak FWHM(deg) |
| | | | Type of element | Content (Atom %) | | | |
| Example 5 | 30 | 480 | Ca | 1.3 | 3.1 | 0.4986 | 0.35 |
| Example 6 | 50 | 500 | Er | 0.4 | 2.4 | 0.4995 | 0.30 |
| Example 7 | 40 | 300 | Y | 0.6 | 1.9 | 0.4991 | 0.80 |
| Example 8 | 35 | 400 | Y | 0.7 | 1.7 | 0.4988 | 0.50 |
| Comparative example 1 | 20 | 320 | — | — | 5.4 | 0.4996 | 1.01 |
| Comparative example 2 | 30 | 340 | — | — | 5.9 | 0.4998 | 1.10 |

TABLE 2

| | FBAR structure | Base film Material | Base film Thickness (μm) | AlN thin film Thickness (μm) | Impedance characteristics Resonant frequency (GHz) | Impedance characteristics Antiresonant frequency (GHz) | Electro-mechanical coupling coefficient $k_t^2$ (%) | Temperature coefficient of frequency $\tau_f$(ppm/° C.) | Acoustic quality factor Q |
|---|---|---|---|---|---|---|---|---|---|
| Example 1 | FIGS. 1, 2 | $SiN_x$ | 0.55 | 1.55 | 2.14 | 2.19 | 4.85 | −7.9 | 770 |
| Example 2 | FIGS. 1, 2 | $SiO_2$ | 0.50 | 1.50 | 2.10 | 2.15 | 5.62 | 6.6 | 810 |
| Example 3 | FIGS. 1, 2 | $SiO_2$ | 0.28 | 1.32 | 2.90 | 2.97 | 5.88 | −3.0 | 640 |
| Example 4 | FIGS. 1, 2 | $SiO_2$ | 0.35 | 1.35 | 2.76 | 2.83 | 6.20 | −0.1 | 1180 |
| Example 5 | FIGS. 3, 4 | $SiN_x$ | 0.50 | 1.60 | 2.09 | 2.14 | 5.03 | −9.9 | 1400 |
| Example 6 | FIGS. 3, 4 | $SiO_2$ | 0.45 | 1.45 | 2.12 | 2.17 | 5.48 | 4.5 | 1120 |
| Example 7 | FIGS. 3, 4 | $SiO_2$ | 0.40 | 1.40 | 2.37 | 2.43 | 5.84 | 2.3 | 580 |
| Example 8 | FIGS. 3, 4 | $SiO_2$ | 0.30 | 1.25 | 2.89 | 2.97 | 6.10 | −1.8 | 930 |
| Comparative example 1 | FIGS. 1, 2 | $SiN_x$ | 0.60 | 1.30 | 2.24 | 2.27 | 3.40 | −28.6 | 150 |
| Comparative example 2 | FIGS. 3, 4 | $SiN_x$ | 0.55 | 1.25 | 2.18 | 2.21 | 3.21 | −29.0 | 140 |

TABLE 3

| | Preparation conditions of piezoelectric film | | | | | | | | | | XPS spectroscopy | X-ray diffraction | |
|---|---|---|---|---|---|---|---|---|---|---|---|---|---|
| | Lower electrode | | Upper electrode | | Thin film forming conditions | | Composition of piezoelectric film (mol ratio) | | | | | | Rocking curve FWHM (deg) |
| | Material | Thickness (nm) | Material | Thickness (nm) | Nitrogen concentration (vol %) | Substrate temperature (° C.) | AlN | GaN | InN | | Oxygen concentration (Atm %) | *Lattice mismatch (%) | |
| Example 9 | Pt/Ti | 110 | Pt/Ti | 110 | 30 | 430 | 0.92 | — | 0.08 | | <0.5 | 1.62 | 1.5 |
| Example 10 | Pt/Ti | 105 | Pt/Ti | 105 | 35 | 380 | 0.85 | 0.15 | — | | <0.5 | 2.31 | 2.3 |
| Example 11 | Pt/Ti | 115 | Pt/Ti | 115 | 25 | 405 | 0.78 | 0.22 | — | | <0.5 | 2.14 | 1.8 |
| Example 12 | Pt/Ti | 120 | Pt/Ti | 120 | 50 | 330 | 0.92 | 0.08 | — | | <0.5 | 2.48 | 3.2 |
| Example 13 | Mo | 115 | Mo | 115 | 45 | 360 | 0.93 | 0.07 | — | | <0.5 | 0.96 | 2.4 |
| Example 14 | Mo | 110 | Mo | 110 | 25 | 380 | 0.91 | 0.09 | — | | <0.5 | 0.92 | 2.0 |
| Example 15 | Mo | 105 | Mo | 105 | 30 | 410 | 0.89 | 0.11 | — | | <0.5 | 0.87 | 1.6 |
| Example 16 | Mo | 100 | Mo | 100 | 35 | 400 | 0.97 | — | 0.03 | | <0.5 | 0.74 | 1.7 |
| Example 17 | W | 110 | W | 110 | 40 | 365 | 0.95 | — | 0.05 | | <0.5 | 0.99 | 2.0 |
| Example 18 | W | 105 | W | 105 | 30 | 395 | 0.94 | — | 0.06 | | <0.5 | 0.89 | 1.8 |
| Comparative example 3 | Pt/Ti | 110 | Pt/Ti | 110 | 45 | 350 | 1.00 | — | — | | 2.7 | 2.87 | 4.4 |
| Comparative example 4 | Mo | 110 | Mo | 110 | 45 | 330 | 1.00 | — | — | | 2.2 | 1.15 | 4.8 |

*In metal crystal with body-centered cubic lattice, 100 * $(L_{M100} - L_{PZa})/L_{M100}$
*In metal crystal with face-centered cubic lattice, 100 * $(L_{M110} - L_{PZ1})/L_{M110}$

TABLE 4

|  | FBAR structure | Insulating layer Material | Insulating layer Thickness (μm) | Piezoelectric film Thickness (μm) | Impedance characteristics Resonant frequency (GHz) | Impedance characteristics Antiresonant frequency (GHz) | Electro-mechanical coupling coefficient $k_t^2$ (%) | Temperature coefficient of frequency $\tau_f$ (ppm/° C.) | Acoustic quality factor Q |
|---|---|---|---|---|---|---|---|---|---|
| Example 9 | FIGS. 1, 2 | SiO$_2$ | 0.28 | 1.32 | 2.83 | 2.91 | 6.17 | −4.5 | 1700 |
| Example 10 | FIGS. 1, 2 | SiO$_2$ | 0.50 | 1.50 | 2.10 | 2.15 | 5.41 | 7.0 | 950 |
| Example 11 | FIGS. 3, 4 | SiO$_2$ | 0.35 | 1.35 | 2.69 | 2.76 | 6.28 | −0.1 | 1290 |
| Example 12 | FIGS. 1, 2 | SiN$_x$ | 0.55 | 1.55 | 2.25 | 2.29 | 4.55 | −7.9 | 640 |
| Example 13 | FIGS. 1, 2 | SiN$_x$ | 0.37 | 1.60 | 2.52 | 2.58 | 5.31 | −10.6 | 1020 |
| Example 14 | FIGS. 1, 2 | SiO$_2$ | 0.45 | 1.45 | 2.26 | 2.32 | 5.69 | 4.8 | 980 |
| Example 15 | FIGS. 3, 4 | SiO$_2$ | 0.40 | 1.40 | 2.37 | 2.43 | 6.09 | 2.4 | 1360 |
| Example 16 | FIGS. 3, 4 | SiO$_2$ | 0.40 | 1.40 | 2.45 | 2.52 | 6.38 | 2.3 | 1230 |
| Example 17 | FIGS. 1, 2 | SiN$_x$ | 0.40 | 1.40 | 3.00 | 3.08 | 5.69 | −9.0 | 700 |
| Example 18 | FIGS. 3, 4 | SiO$_2$ | 0.33 | 1.28 | 2.91 | 2.98 | 6.28 | −0.2 | 1100 |
| Comparative example 3 | FIGS. 1, 2 | SiO$_2$ | 0.60 | 1.30 | 2.24 | 2.26 | 2.98 | 21.1 | 410 |
| Comparative example 4 | FIGS. 3, 4 | SiO$_2$ | 0.55 | 1.25 | 2.18 | 2.20 | 2.62 | 19.1 | 370 |

TABLE 5

Materials, thickness, and properties of metal layers constituting lower electrode, lower electrode-piezoelectric thin film interface, and upper electrode

| | Lower electrode Adhesive layer Material | Lower electrode Adhesive layer Thickness (nm) | Lower electrode Second metal layer b Material | Lower electrode Second metal layer b Thickness (nm) | Lower electrode Second metal layer b FWHM (deg) | Lower electrode First metal layer a Material | Lower electrode First metal layer a Thickness (nm) | Lower electrode First metal layer a FWHM (deg) | Interface layer between lower electrode-piezoelectric thin film Material | Interface layer between lower electrode-piezoelectric thin film Thickness (nm) | Upper electrode Adhesive layer Material | Upper electrode Adhesive layer Thickness (nm) | Upper electrode Fourth metal layer d Material | Upper electrode Fourth metal layer d Thickness (nm) | Upper electrode Third metal layer C Material | Upper electrode Third metal layer C Thickness (nm) |
|---|---|---|---|---|---|---|---|---|---|---|---|---|---|---|---|---|
| Example 19 | — | — | Au | 60 | 2.3 | Mo | 150 | 2.4 | — | — | — | — | Al | 190 | — | — |
| Example 20 | Ti | 30 | Pt | 45 | 1.5 | Mo | 145 | 2.0 | — | — | Ti | 30 | Pt | 40 | Mo | 130 |
| Example 21 | Ti | 25 | Au | 50 | 1.3 | Mo | 140 | 1.4 | — | — | — | — | — | — | Mo | 195 |
| Example 22 | Ti | 25 | Au | 60 | 1.4 | Mo | 130 | 1.5 | SiN$_x$ | 9 | Ni | 25 | Au | 55 | Mo | 115 |
| Example 23 | Ti | 35 | Au | 45 | 1.3 | Mo | 135 | 1.3 | Al | 7 | — | — | — | — | Mo | 195 |
| Example 24 | V | 35 | Au | 40 | 1.7 | Mo (TZM alloy) | 140 | 1.8 | — | — | — | — | Au | 35 | Mo (TZM alloy) | 160 |
| Example 25 | Cr | 30 | Au | 45 | 2.0 | Mo—Re alloy | 150 | 2.1 | — | — | Ti | 30 | Au | 40 | Mo—Re alloy | 135 |
| Example 26 | Ti | 20 | Al | 55 | 2.5 | Mo | 135 | 2.6 | — | — | — | — | Al | 45 | Mo | 140 |
| Example 27 | Ta | 35 | Ir | 40 | 4.9 | W | 140 | 5.5 | — | — | — | — | Al | 195 | — | — |
| Example 28 | Mg alloy* | 15 | Pt | 55 | 3.5 | W—Mo alloy | 150 | 4.4 | — | — | Cr | 20 | Pt | 35 | W—Mo alloy | 135 |
| Example 29 | Ni | 35 | Pt | 45 | 3.3 | W—Re alloy | 130 | 4.3 | — | — | Nb | 35 | — | — | W—Re alloy | 165 |
| Example 30 | Hf | 25 | Ir | 50 | 3.1 | Nb | 135 | 3.5 | — | — | Ta | 25 | Ir | 45 | Nb | 120 |

TABLE 5-continued

Materials, thickness, and properties of metal layers constituting lower electrode, lower electrode-piezoelectric thin film interface, and upper electrode

| | Lower electrode | | | | | | Interface layer between lower electrode-piezoelectric thin film | | Upper electrode | | | | | |
|---|---|---|---|---|---|---|---|---|---|---|---|---|---|---|
| | Adhesive layer | | Second metal layer b | | | First metal layer a | | | | Adhesive layer | | Fourth metal layer d | | Third metal layer C | |
| | Material | Thickness (nm) | Material | Thickness (nm) | FWHM (deg) | Material | Thickness (nm) | FWHM (deg) | Material | Thickness (nm) | Material | Thickness (nm) | Material | Thickness (nm) | Material | Thickness (nm) |
| Example 31 | Zr | 30 | Au | 45 | 3.4 | W | 150 | 3.6 | — | — | Zr | 30 | Au | 40 | W | 135 |
| Example 32 | — | — | Pt | 45 | 3.3 | W—Cu—Ni alloy | 140 | 4.2 | — | — | — | — | — | — | W—Cu—Ni alloy | 160 |
| Comparative example 5 | — | — | Ni | 145 | 14.0 | W | 75 | 8.0 | — | — | — | — | Ni | 40 | W | 160 |
| Comparative example 6 | — | — | — | — | — | Mo | 200 | 15.0 | — | — | — | — | — | — | Mo | 180 |
| Comparative example 7 | — | — | — | — | — | W | 200 | 26.4 | — | — | — | — | — | — | W | 180 |
| Comparative example 8 | — | — | Au | 220 | 2.2 | — | — | — | — | — | — | — | Au | 190 | — | — | a: metal with body-centered cubic structure,
b: metal with face-centered cubic structure,
c: metal with body-centered cubic structure,
d: metal with face-centered cubic structure,
*Mg—Al—Zn—Mn alloy
FWHM: full-width half maximum of a rocking curve in X-ray diffraction

TABLE 6

Forming conditions, composition, and X-ray diffraction measurement results of AlN piezoelectric thin film

| | Forming conditions of AlN thin film | | | Properties of AlN thin film | | |
|---|---|---|---|---|---|---|
| | | | | XPS spectroscopy | X-ray diffraction | |
| | Film forming pressure (Pa) | Nitrogen concentration (vol %) | Substrate temperature (° C.) | Oxygen concentration (Atm %) | Lattice constant c-axis length (nm) | Rocking curve FWHM (deg) |
| Example 19 | 1.15 | 30 | 350 | <0.5 | 0.4979 | 2.4 |
| Example 20 | 1.00 | 35 | 300 | <0.5 | 0.4981 | 2.2 |
| Example 21 | 0.67 | 25 | 325 | <0.5 | 0.4976 | 1.7 |
| Example 22 | 0.82 | 50 | 305 | <0.5 | 0.4991 | 2.0 |
| Example 23 | 0.60 | 50 | 315 | <0.5 | 0.4990 | 1.9 |
| Example 24 | 0.75 | 35 | 340 | <0.5 | 0.4981 | 2.1 |
| Example 25 | 0.90 | 45 | 290 | <0.5 | 0.4987 | 2.3 |
| Example 26 | 1.08 | 25 | 275 | <0.5 | 0.4976 | 2.5 |
| Example 27 | 0.98 | 30 | 275 | <0.5 | 0.4979 | 3.5 |

TABLE 6-continued

Forming conditions, composition, and X-ray diffraction measurement results of AlN piezoelectric thin film

| | Forming conditions of AlN thin film | | | Properties of AlN thin film | | |
|---|---|---|---|---|---|---|
| | | | | XPS spectroscopy | X-ray diffraction | |
| | Film forming pressure (Pa) | Nitrogen concentration (vol %) | Substrate temperature (° C.) | Oxygen concentration (Atm %) | Lattice constant c-axis length (nm) | Rocking curve FWHM (deg) |
| Example 28 | 0.80 | 50 | 285 | <0.5 | 0.4990 | 3.2 |
| Example 29 | 0.88 | 45 | 340 | <0.5 | 0.4987 | 3.1 |
| Example 30 | 0.74 | 40 | 305 | <0.5 | 0.4984 | 2.8 |
| Example 31 | 0.58 | 35 | 320 | <0.5 | 0.4981 | 2.9 |
| Example 32 | 0.65 | 30 | 290 | <0.5 | 0.4979 | 3.1 |
| Comparative example 5 | 0.70 | 45 | 315 | 1.2 | 0.4987 | 5.3 |
| Comparative example 6 | 0.93 | 45 | 285 | 2.2 | 0.4986 | 10.7 |
| Comparative example 7 | 0.78 | 45 | 285 | 2.5 | 0.4988 | 12.4 |
| Comparative example 8 | 0.85 | 40 | 280 | <0.5 | 0.4984 | 2.9 |

TABLE 7

Constitution of FBAR prepared using AlN piezoelectric thin film and characteristics, performances of resonator

| | FBAR structure | Insulating film | | Piezoelectric thin film | Impedance characteristics | | Electromechanical coupling coefficient $k_t^2$ | Acoustic quality factor Q |
|---|---|---|---|---|---|---|---|---|
| | | Material | Thickness (μm) | Thickness (μm) | Resonant frequency (GHz) | Antiresonant frequency (GHz) | (%) | |
| Example 19 | FIGS. 7, 8 | SiO$_2$ | 0.20 | 0.98 | 1.93 | 1.98 | 5.97 | 922 |
| Example 20 | FIGS. 7, 8 | SiO$_2$ | 0.30 | 1.10 | 1.95 | 2.00 | 6.12 | 1040 |
| Example 21 | FIGS. 7, 8 | — | — | 1.50 | 2.28 | 2.35 | 6.50 | 1270 |
| Example 22 | FIGS. 7, 8 | SiN$_x$ | 0.25 | 1.30 | 2.06 | 2.11 | 6.27 | 1126 |
| Example 23 | FIGS. 7, 8 | SiN$_x$ | 0.40 | 1.40 | 1.98 | 2.03 | 6.35 | 1178 |
| Example 24 | FIGS. 3, 4 | SiN$_x$ | 0.35 | 1.15 | 2.16 | 2.22 | 6.19 | 1130 |
| Example 25 | FIGS. 3, 4 | SiN$_x$ | 0.37 | 1.45 | 1.86 | 1.91 | 6.04 | 1025 |
| Example 26 | FIGS. 3, 4 | SiO$_2$ | 0.43 | 1.05 | 1.80 | 1.84 | 5.88 | 926 |
| Example 27 | FIGS. 7, 8 | SiO$_2$ | 0.30 | 0.99 | 1.87 | 1.91 | 5.05 | 623 |
| Example 28 | FIGS. 7, 8 | SiO$_2$ | 0.20 | 1.30 | 2.07 | 2.12 | 5.23 | 707 |
| Example 29 | FIGS. 7, 8 | SiN$_x$ | 0.25 | 1.20 | 2.32 | 2.37 | 5.30 | 740 |
| Example 30 | FIGS. 7, 8 | SiN$_x$ | 0.30 | 1.35 | 1.98 | 2.02 | 5.35 | 712 |
| Example 31 | FIGS. 3, 4 | — | — | 1.40 | 2.35 | 2.41 | 5.53 | 781 |
| Example 32 | FIGS. 3, 4 | SiO$_2$ | 0.28 | 1.28 | 2.02 | 2.06 | 5.30 | 779 |
| Comparative example 5 | FIGS. 7, 8 | SiO$_2$ | 0.38 | 1.00 | 1.92 | 1.95 | 3.48 | 390 |
| Comparative example 6 | FIGS. 7, 8 | SiO$_2$ | 0.35 | 1.05 | 1.90 | 1.92 | 1.95 | 235 |
| Comparative example 7 | FIGS. 3, 4 | SiO$_2$ | 0.35 | 1.10 | 1.86 | 1.88 | 1.57 | 246 |
| Comparative example 8 | FIGS. 7, 8 | SiO$_2$ | 0.40 | 0.78 | 1.83 | 1.86 | 3.91 | 407 |

INDUSTRIAL APPLICABILITY

As described above, according to a thin film bulk acoustic resonator of the present invention, since an aluminum nitride thin film containing an alkaline earth metal or rare earth metal is used as a piezoelectric film, it is possible to improve an electromechanical coupling coefficient, acoustic quality factor (Q value), and frequency temperature characteristic.

Moreover, as described above, according to the thin film bulk acoustic resonator of the present invention, since a thin film composed of a solid solution of aluminum nitride and gallium nitride or that composed of the solid solution of aluminum nitride and indium nitride is used as the piezoelectric film, it is possible to improve the electromechanical coupling coefficient, acoustic quality factor (Q value), and frequency temperature characteristic.

Furthermore, as described above, in an aluminum nitride thin film-metal electrode stacked structure of the present invention, a thin film of a metal with face-centered cubic structure from which a highly oriented thin film is easily obtained, and that of a metal with body-centered cubic structure having a high elastic modulus are stacked.

Accordingly, a stacked metal electrode film having uniaxial orientation and high elastic modulus is formed, and the aluminum nitride thin film is allowed to grow on the stacked metal electrode film. Therefore, a c-axis oriented aluminum nitride thin film having highly uniaxial orientation and high crystallinity is obtained in which a rocking curve of a (0002) plane diffraction peak has a steep peak and small value of full-width half maximum (FWHM).

Additionally, in a thin film piezoelectric resonator of the present invention, with use of the above-described aluminum nitride thin film-metal electrode stacked structure, a combination of one metal electrode formed of a high elastic modulus and highly oriented metal thin film, and a c-axis oriented aluminum nitride piezoelectric thin film having highly uniaxial orientation and high crystallinity is constituted, and the other metal electrode is formed on the combination to prepare FBAR or SBAR. Accordingly, the performances such as the electromechanical coupling coefficient and acoustic quality factor (Q value) are remarkably improved. As a result, it is possible to prepare FBAR or SBAR having characteristics higher than ever before. This can be used to provide thin film piezoelectric devices which are little in loss at a high frequency band and excellent in gain and band characteristics, such as a thin film bulk acoustic filter, a thin film VCO, and a duplexer or transmission/reception branching filter.

What is claimed is:

1. A thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a piezoelectric film, and an upper electrode stacked in this order on the side of the substrate, the substrate comprising a gap formed in a region corresponding to the vibratory section to allow vibration of the vibratory section, wherein the piezoelectric film is an aluminum nitride thin film containing an alkaline earth metal and/or a rare earth metal.

2. The thin film bulk acoustic resonator according to claim 1, wherein a content of the alkaline earth metal and the rare earth metal in the piezoelectric film is in a range of 0.2 to 3.0 atom %.

3. The thin film bulk acoustic resonator according to claim 1, wherein the piezoelectric film indicates a C-axis orientation, and full-width half maximum of a rocking curve of an X-ray diffraction peak of (0002) plane of the piezoelectric film is 3.0° or less.

4. The thin film bulk acoustic resonator according to claim 1, wherein the piezoelectric film has a C-axis length in a range of 0.4978 to 0.4993 nm.

5. The thin film bulk acoustic resonator according to claim 1, wherein for the piezoelectric film, full-width half maximum of a 2θ rotation angle of an X-ray diffraction peak of (0002) plane is 0.6° or less.

6. The thin film bulk acoustic resonator according to claim 1, wherein a base film is formed between the substrate and the piezoelectric stacked structure, and the vibratory section also includes a part of the base film.

7. The thin film bulk acoustic resonator according to claim 6, wherein the base film is a dielectric film containing silicon oxide which is a major component, a dielectric film containing silicon nitride which is the major component, or a stacked film of the dielectric film containing silicon oxide which is the major component and the dielectric film containing silicon nitride which is the major component.

8. The thin film bulk acoustic resonator according to claim 1, wherein the substrate is made of a single crystal silicon.

9. The thin film bulk acoustic resonator according to claim 1, wherein the upper electrode comprises a first electrode portion and a second electrode portion formed apart from each other.

10. The thin film bulk acoustic resonator according to claim 1, wherein an electromechanical coupling coefficient obtained from measured values of a resonant frequency and an antiresonant frequency in a range of 2.0 to 3.0 GHz is 4.5% or more.

11. A thin film bulk acoustic resonator comprising: a vibratory section including a part of a piezoelectric stacked structure including a piezoelectric film and electrodes formed on opposite surfaces of the piezoelectric film, wherein the piezoelectric film is an uniaxially oriented crystal film comprising a solid solution of aluminum nitride and gallium nitride represented by a general formula $Al_{1-x}Ga_xN$ (additionally, 0<x<1) or a solid solution of aluminum nitride and indium nitride represented by a general formula $Al_{1-y}In_yN$ (additionally, 0<y<1).

12. The thin film bulk acoustic resonator according to claim 11, wherein the piezoelectric stacked structure comprises a plurality of piezoelectric films and electrodes formed on opposite surfaces of each of the plurality of piezoelectric films.

13. The thin film bulk acoustic resonator according to claim 11, wherein a peripheral portion of the piezoelectric stacked structure is supported by the substrate and a middle portion of the piezoelectric stacked structure constitutes the vibratory section.

14. The thin film bulk acoustic resonator according to claim 13, wherein an insulating layer is formed between the substrate and the piezoelectric stacked structure, and the vibratory section also includes a part of the insulating layer.

15. The thin film bulk acoustic resonator according to claim 14, wherein the insulating layer is a dielectric film containing silicon oxide which is a major component, a dielectric film containing silicon nitride which is the major component, or a stacked film of the dielectric film containing silicon oxide which is the major component and the dielectric film containing silicon nitride which is the major component.

16. The thin film bulk acoustic resonator according to claim 13, wherein the substrate is made of a semiconductor or an insulator.

17. The thin film bulk acoustic resonator according to claim 16, wherein the substrate is made of a single crystal silicon.

18. The thin film bulk acoustic resonator according to claim 11, wherein the piezoelectric film or the first piezoelectric film and the second piezoelectric film indicate a C-axis orientation, and full-width half maximum of a rocking curve of an X-ray diffraction peak of (0002) plane of the piezoelectric film or the first and second piezoelectric films is 3.0° or less.

19. A thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a piezoelectric film, and an upper electrode stacked in this order on the side of the substrate, the substrate comprising a gap formed in a region corresponding to the vibratory section to allow vibration of the vibratory section, wherein the piezoelectric film is an uniaxially oriented crystal film comprising a solid solution of aluminum nitride and gallium nitride represented by a general formula $Al_{1-x}Ga_xN$ (additionally, 0<x<1) or a solid solution of aluminum nitride and indium nitride represented by a general formula $Al_{1-y}In_yN$ (additionally, 0<y<1).

20. The thin film bulk acoustic resonator according to claim 19, wherein the upper electrode comprises a first electrode portion and a second electrode portion formed apart from each other.

21. The thin film bulk acoustic resonator according to claim 19, wherein an insulating layer is formed between the substrate and the piezoelectric stacked structure, and the vibratory section also includes a part of the insulating layer.

22. The thin film bulk acoustic resonator according to claim 21, wherein the insulating layer is a dielectric film containing silicon oxide which is a major component, a dielectric film containing silicon nitride which is the major component, or a stacked film of the dielectric film containing silicon oxide which is the major component and the dielectric film containing silicon nitride which is the major component.

23. The thin film bulk acoustic resonator according to claim 19, wherein the substrate is made of a semiconductor or an insulator.

24. The thin film bulk acoustic resonator according to claim 23, wherein the substrate is made of a single crystal silicon.

25. The thin film bulk acoustic resonator according to claim 19, wherein the piezoelectric film or the first piezoelectric film and the second piezoelectric film indicate a C-axis orientation, and full-width half maximum of a rocking curve of an X-ray diffraction peak of (0002) plane of the piezoelectric film or the first and second piezoelectric films is 3.0° or less.

26. A thin film bulk acoustic resonator comprising: a substrate; and a piezoelectric stacked structure formed on the substrate, a part of the piezoelectric stacked structure being used to constitute a vibratory section, the piezoelectric stacked structure comprising a lower electrode, a first piezoelectric film, an inner electrode, a second piezoelectric film, and an upper electrode stacked in this order on the side of the substrate, the substrate comprising a gap formed in a region corresponding to the vibratory section to allow vibration of the vibratory section,
wherein each of the first piezoelectric film and the second piezoelectric film is an uniaxially oriented crystal film comprising a solid solution of aluminum nitride and gallium nitride represented by a general formula $Al_{1-x}Ga_xN$ (additionally, 0<x<1) or a solid solution of aluminum nitride and indium nitride represented by a general formula $Al_{1-y}In_yN$ (additionally, 0<y<1).

27. The thin film bulk acoustic resonator according to claim 26, wherein an insulating layer is formed between the substrate and the piezoelectric stacked structure, and the vibratory section also includes a part of the insulating layer.

28. The thin film bulk acoustic resonator according to claim 27, wherein the insulating layer is a dielectric film containing silicon oxide which is a major component, a dielectric film containing silicon nitride which is the major component, or a stacked film of the dielectric film containing silicon oxide which is the major component and the dielectric film containing silicon nitride which is the major component.

29. The thin film bulk acoustic resonator according to claim 26, wherein the substrate is made of a semiconductor or an insulator.

30. The thin film bulk acoustic resonator according to claim 29, wherein the substrate is made of a single crystal silicon.

31. The thin film bulk acoustic resonator according to claim 26, wherein the piezoelectric film or the first piezoelectric film and the second piezoelectric film indicate a C-axis orientation, and full-width half maximum of a rocking curve of an X-ray diffraction peak of (0002) plane of the piezoelectric film or the first and second piezoelectric films is 3.0° or less.

32. An aluminum nitride thin film-metal electrode stacked structure comprising: a metal electrode; and an aluminum nitride thin film at least a part of which is formed on the metal electrode and which indicates a c-axis orientation,
wherein the metal electrode comprises two or more metal layers including a stacked layer of a first metal layer with body-centered cubic structure and a second metal layer with face-centered cubic structure, and a thickness of the first metal layer is 0.5 times or more that of the metal electrode.

33. The aluminum nitride thin film-metal electrode stacked structure according to claim 32, wherein the first metal layer is made of a metal selected from molybdenum, tungsten, an alloy mainly containing molybdenum, and an alloy mainly containing tungsten.

34. The aluminum nitride thin film-metal electrode stacked structure according to claim 32, wherein the second metal layer is made of a metal selected from iridium, platinum, gold, aluminum, silver, an alloy mainly containing iridium, an alloy mainly containing platinum, an alloy mainly containing gold, an alloy mainly containing aluminum, and an alloy mainly containing silver.

35. The aluminum nitride thin film-metal electrode stacked structure according to claim 32, wherein the aluminum nitride thin film is formed in contact with the first metal layer.

36. The aluminum nitride thin film-metal electrode stacked structure according to claim 32, wherein an interface layer comprising a metal layer or a compound layer having a thickness of 0.1 time or less that of the metal electrode is formed between the aluminum nitride thin film and the first metal layer.

37. The aluminum nitride thin film-metal electrode stacked structure according to claim 36, wherein the interface layer is made of a metal or compound selected from aluminum, silicon, an alloy or compound mainly containing aluminum, and an alloy or compound mainly containing silicon.

38. The aluminum nitride thin film-metal electrode stacked structure according to claim 32, wherein an adhesive metal layer is formed on the surface of the second metal layer on the side opposite to a side facing the first metal layer.

39. The aluminum nitride thin film-metal electrode stacked structure according to claim 38, wherein the adhesive metal layer is made of a metal selected from magnesium, titanium, vanadium, zirconium, hafnium, niobium, tantalum, chromium, nickel, an alloy mainly containing magnesium, an alloy mainly containing titanium, an alloy mainly containing vanadium, an alloy mainly containing zirconium, an alloy mainly containing hafnium, an alloy mainly containing niobium, an alloy mainly containing tantalum, an alloy mainly containing chromium, and an alloy mainly containing nickel.

40. The aluminum nitride thin film-metal electrode stacked structure according to claim 32, wherein full-width half maximum (FWHM) of a rocking curve of (0002) diffraction peak of the aluminum nitride thin film is less than 3.3°.

41. The aluminum nitride thin film-metal electrode stacked structure according to claim 32, wherein full-width half maximum (FWHM) of a rocking curve of (110) diffraction peak of the first metal layer is less than 4.5°.

42. A thin film piezoelectric resonator comprising: a piezoelectric thin film held between a plurality of electrodes, the piezoelectric thin film being bridged in a central part thereof with a peripheral part thereof used as a support, wherein the piezoelectric thin film and one of the electrodes comprise the aluminum nitride thin film-metal electrode stacked structure according to claim 32.

43. A thin film piezoelectric resonator comprising: a substrate comprising a semiconductor or insulator including a vibration space; and a stacked structure in which a lower electrode, a piezoelectric thin film, and an upper electrode are stacked in this order in a position facing the vibration space of the substrate, wherein the piezoelectric thin film and the lower electrode comprise the aluminum nitride thin film-metal electrode stacked structure according to claim 32.

44. The thin film piezoelectric resonator according to claim 43, wherein the upper electrode comprises two electrode portions disposed apart from each other.

45. The thin film piezoelectric resonator according to claim 43, wherein an insulating layer containing at least one layer of silicon oxide and/or silicon nitride which is a major component is attached to the stacked structure in the position facing the vibration space.

46. The thin film piezoelectric resonator according to claim 43, wherein the upper electrode contains a metal selected from molybdenum, tungsten, niobium, aluminum, an alloy mainly containing molybdenum, an alloy mainly containing tungsten, an alloy mainly containing niobium, and an alloy mainly containing aluminum.

47. The thin film piezoelectric resonator according to claim 43, wherein the upper electrode comprises a stacked layer of two or more types of metal layers each made of a metal selected from molybdenum, tungsten, niobium, an alloy mainly containing molybdenum, an alloy mainly containing tungsten, an alloy mainly containing niobium, iridium, platinum, gold, silver, an alloy mainly containing iridium, an alloy mainly containing platinum, an alloy mainly containing gold, an alloy mainly containing silver, magnesium, aluminum, titanium, vanadium, zirconium, hafnium, tantalum, chromium, nickel, an alloy mainly containing magnesium, an alloy mainly containing aluminum, an alloy mainly containing titanium, an alloy mainly containing vanadium, an alloy mainly containing zirconium, an alloy mainly containing hafnium, an alloy mainly containing tantalum, an alloy mainly containing chromium, and an alloy mainly containing nickel.

48. A thin film piezoelectric resonator comprising: a substrate comprising a semiconductor or insulator including a vibration space; and a stacked structure in which a lower electrode, a first piezoelectric thin film, an inner electrode, a second piezoelectric thin film, and an upper electrode are stacked in this order in a position facing the vibration space of the substrate, wherein the first piezoelectric thin film and the lower electrode comprise the aluminum nitride thin film-metal electrode stacked structure according to claim 32.

49. The thin film piezoelectric resonator according to claim 48, wherein an insulating layer containing at least one layer of silicon oxide and/or silicon nitride which is a major component is attached to the stacked structure in the position facing the vibration space.

50. The thin film piezoelectric resonator according to claim 48, wherein each of the upper electrode and the inner electrode contains a metal selected from molybdenum, tungsten, niobium, aluminum, an alloy mainly containing molybdenum, an alloy mainly containing tungsten, an alloy mainly containing niobium, and an alloy mainly containing aluminum.

51. The thin film piezoelectric resonator according to claim 48, wherein each of the upper electrode and the inner electrode comprises a stacked layer of two or more types of metal layers each made of a metal selected from molybdenum, tungsten, niobium, an alloy mainly containing molybdenum, an alloy mainly containing tungsten, an alloy mainly containing niobium, iridium, platinum, gold, silver, an alloy mainly containing iridium, an alloy mainly containing platinum, an alloy mainly containing gold, an alloy mainly containing silver, magnesium, aluminum, titanium, vanadium, zirconium, hafnium, tantalum, chromium, nickel, an alloy mainly containing magnesium, an alloy mainly containing aluminum, an alloy mainly containing titanium, an alloy mainly containing vanadium, an alloy mainly containing zirconium, an alloy mainly containing hafnium, an alloy mainly containing tantalum, an alloy mainly containing chromium, and an alloy mainly containing nickel.

* * * * *